(12) United States Patent
Sazuka et al.

(10) Patent No.: US 7,210,834 B2
(45) Date of Patent: *May 1, 2007

(54) VEHICULAR LAMP AND LIGHT SOURCE MODULE

(75) Inventors: Kiyoshi Sazuka, Shizuoka-ken (JP); Hiroyuki Ishida, Shizuoka-ken (JP); Masashi Tatsukawa, Shizuoka-ken (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 76 days.

This patent is subject to a terminal disclaimer.

(21) Appl. No.: 10/891,046

(22) Filed: Jul. 15, 2004

(65) Prior Publication Data

US 2005/0018445 A1   Jan. 27, 2005

(30) Foreign Application Priority Data

Jul. 24, 2003   (JP) .............................. 2003-279425

(51) Int. Cl.
*B60Q 1/00*   (2006.01)

(52) U.S. Cl. ...................... 362/548; 362/539; 362/545; 362/549

(58) Field of Classification Search ................ 362/294, 362/520, 536, 545, 800, 455, 539, 548, 549, 362/555

See application file for complete search history.

(56) References Cited

U.S. PATENT DOCUMENTS

| | | | | |
|---|---|---|---|---|
| 5,283,802 A | * | 2/1994 | Hsiung | ........................ 372/107 |
| 5,848,839 A | * | 12/1998 | Savage, Jr. | ................. 362/267 |
| 6,200,003 B1 | | 3/2001 | Tseng | |
| 2001/0019486 A1 | | 9/2001 | Thominet | |
| 2002/0113244 A1 | | 8/2002 | Barnett | |
| 2003/0076690 A1 | | 4/2003 | Takahashi | |
| 2005/0018446 A1 | * | 1/2005 | Ishida | ........................ 362/545 |

FOREIGN PATENT DOCUMENTS

| | | |
|---|---|---|
| DE | 195 11 229 A1 | 10/1995 |
| DE | 202 06 833 U1 | 7/2002 |
| EP | 0 896 898 A2 | 2/1999 |
| EP | 1 357 332 A2 | 10/2003 |
| GB | 2 401 928 A | 11/2004 |
| JP | 6-89601 A | 3/1994 |
| JP | 2002 245812 A | 8/2002 |
| JP | 2003-31007 A | 1/2003 |
| JP | 2003-31011 A | 1/2003 |
| JP | 2003-123517 A | 4/2003 |

* cited by examiner

*Primary Examiner*—Stephen Husar
*Assistant Examiner*—Meghan K. Dunwiddie
(74) *Attorney, Agent, or Firm*—Sughrue Mion, PLLC

(57) ABSTRACT

A vehicular lamp for use in an automobile, comprises: a light source module for generating light; an optical member operable to emit the light produced by the light source module out of the vehicular lamp; and a light source fixing member for fixing the light source module to a reference position a relative position of which with respect to the optical member is predetermined, wherein the light source module includes: a reference member which is fixed to be fitted to the reference position when the light source module is fixed to the optical member, a semiconductor light emitting element for emitting light from a lighting region that is predetermined; and a holding member for fitting a center of the lighting region to a position a relative position of which with respect to the reference member is predetermined, so as to hold the semiconductor-emitting light.

11 Claims, 22 Drawing Sheets

VEHICULAR LAMP AND LIGHT SOURCE MODULE

This patent application claims priority from a Japanese patent application No. 2003-279425 filed on Jul. 24, 2003, the contents of which are incorporated herein by reference.

BACKGROUND OF THE INVENTION

1. Field of the Invention

The present invention relates to a vehicular lamp and also to a light source module. More particularly, the present invention relates to a vehicular lamp and a light source module for use in a vehicle such as an automobile.

2. Related Art

A vehicular lamp such as a headlamp of an automobile is required to form a light distribution pattern with high accuracy for safety reasons. This light distribution pattern is formed by an optical system using a reflector or lens as disclosed, for example, in Japanese Patent Application Publication (Laid-Open) No. 6-89601. Recently it is considered to use semiconductor light-emitting element for a vehicular lamp.

In optical design for generating the light distribution pattern of the vehicular lamp, it is necessary to consider a shape of a light source or the like, in some cases. Moreover, a semiconductor light-emitting element generates light from a light source on its entire surface that has a predetermined width on its entire surface. Thus, in the case of using the semiconductor emitting light element for the vehicular lamp, the optical design may become complicated, resulting in difficulty in forming an appropriate light distribution pattern.

SUMMARY OF THE INVENTION

Therefore, it is an object of the present invention to provide a vehicular lamp and a light source module, which are capable of overcoming the above drawbacks accompanying the conventional art. The above and other objects can be achieved by combinations described in the independent claims. The dependent claims define further advantageous and exemplary combinations of the present invention.

According to the first aspect of the present invention, a vehicular lamp for use in an automobile, comprises: a light source module for generating light; an optical member operable to emit the light produced by the light source module out of the vehicular lamp; and a light source fixing member for fixing the light source module to a reference position a relative position of which with respect to the optical member is predetermined, wherein the light source module includes: a reference member which is fixed to be fitted to the reference position when the light source module is fixed to the optical member, a semiconductor light emitting element for emitting light from a lighting region that is predetermined; and a holding member for fitting a center of the lighting region to a position a relative position of which with respect to the reference member is predetermined, so as to hold the semiconductor-emitting light.

The reference member may be one side of the holding member, and the light source fixing member may have a reference side to indicate the reference position and allow a plane which includes one side to come into contact with a plane which includes the reference side so as to fit the reference member to the reference position, thereby fixing the light source module.

The reference member may be a hole or a projection formed in the holding member, and the light source fixing member may include a connecting member which is to be connected to the reference member corresponding to the hole or the projection at the position of the reference position.

The light source module may have at least two reference positions, and the light source fixing member may have at least two connecting members which are connected to at least each of two reference members, and one of the two connecting members may connect the reference members corresponding, including a mechanical play extending in the direction connecting one connecting member to the other connecting member.

The reference member may include a first reference section such as the hole or the projection and a second reference section such as a side of the holding member, and the light source fixing member may have a reference side to indicate the reference position and allow a plane which includes one side to come into contact with a plane which includes the reference side so as to fit the reference member to the reference position.

According to the second aspect of the present invention, a light source module for generating light, comprises; a reference member which is fitted to a reference position that is predetermined so as to fix the light source module when the light source module is fixed to the reference position, a semiconductor light emitting element for emitting light from a lighting region that is predetermined; and a holding member for fitting a center of said lighting region to a position a relative position of which with respect to the reference member is predetermined, so as to hold the semiconductor-emitting light.

The vehicular lamp to which the present invention may be applied includes headlamps such as a regular headlamp, fog lamp or cornering lamp for automobiles, motorcycles or trains. The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
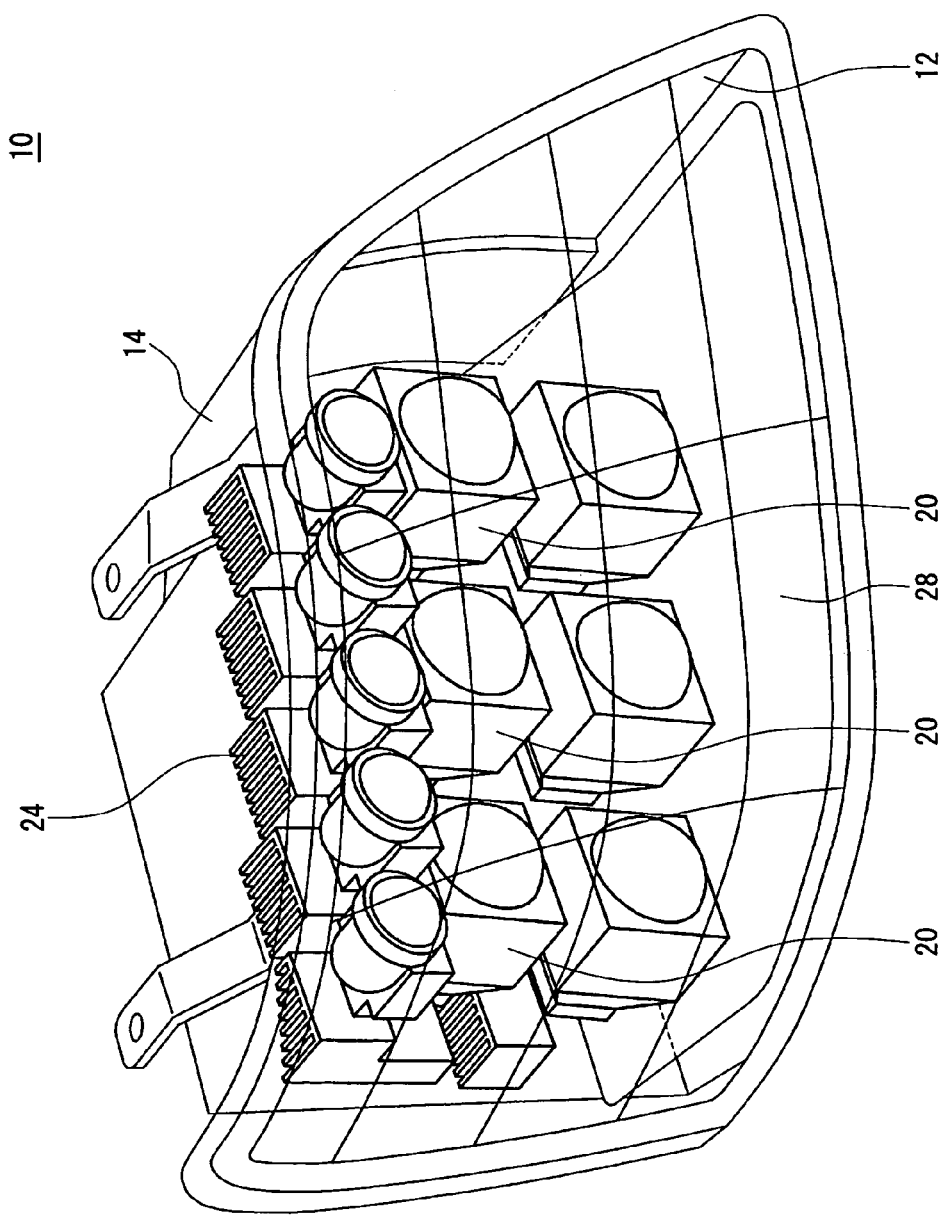
FIG. 1 is a perspective view of a vehicular lamp according to an embodiment of the present invention.
Figure 2:
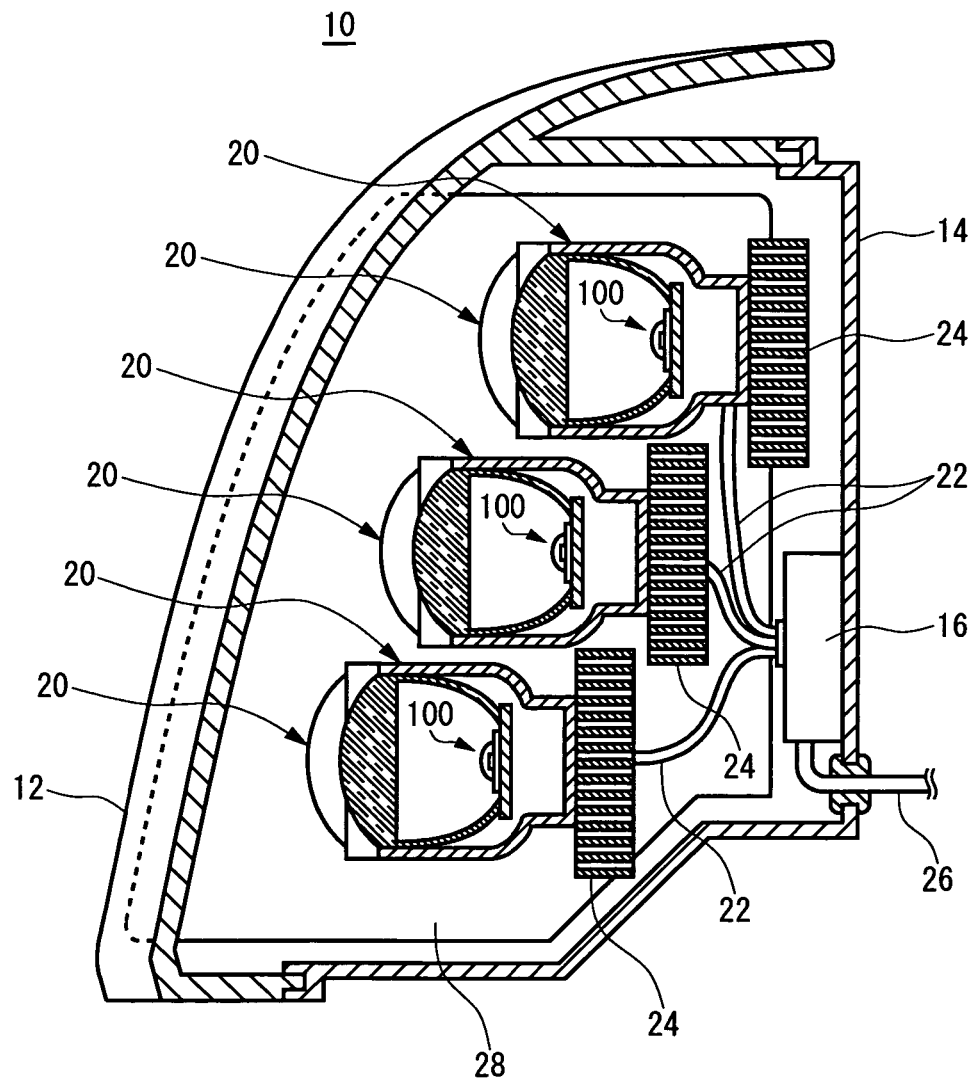
FIG. 2 is a horizontal cross-sectional view of the vehicular lamp.

FIGS. 1 and 2 show an exemplary structure of a vehicular lamp 10 according to an embodiment of the present invention. FIG. 1 is a perspective view of the vehicular lamp 10, and FIG. 2 is a cross-sectional view thereof taken along a horizontal plane crossing respective light source units 20 in the middle stage. The vehicular lamp 10 is an automotive headlamp for use in an automobile as an exemplary one of the vehicle, and emits light forward of the automobile. The vehicular lamp 10 includes a plurality of light source units 20, a cover 12, a lamp body 14, a circuit unit 16, a plurality of heat-radiation members 24, an extension reflector 28, a cable 22 and a cable 26.

Each of the light source units 20 includes a LED module 100, and emits light having a predetermined light distribution pattern forward of the automobile in accordance with light generated by the LED module 100. The light source unit 20 is supported by a lamp body 14, for example, so as to be inclined by an aiming mechanism for adjusting a direction of an optical axis of the light source unit 20. The light source unit 20 may be supported by the lamp body 14 in such a manner that its optical axis is at a downward angle of about 0.3° to about 0.6° with the horizontal plane when the vehicular lamp 10 is mounted on the body of the automobile.

The light source units 20 may have the same or similar light distribution characteristics or different light distribution characteristics. In an alternative embodiment, one light source unit 20 may include a plurality of light source modules 100. The light source unit 20 may include a semiconductor laser in place of the light source module 100, for example.

The cover 12 and the lamp body 14 form a lamp room of the vehicular lamp 10 and it accommodates a plurality of light source units 20. The cover 12 and the lamp body 14 may air-tightly seal the light source unit 20 and protect it from water. The cover 12 is formed to be transparent from material that can transmit light generated by the LED module 100, for example, and is provided on a front face of the automobile so as to cover the light source units 20 from the front. The lamp body 14 is provided to be opposed to the cover 12 with the light source units 20 interposed therebetween so as to cover the light source units 20 from behind. The lamp body 14 may be formed integrally with the body of the automobile.

The circuit unit 16 is a module in which a lighting circuit for lighting the LED module 100 and the like are formed therein. The circuit unit 16 is electrically connected to the light source unit 20 via the cable 22. The circuit unit 16 is also connected to the outside of the vehicular lamp 10 electrically via the cable 26.

The heat radiating members 24 are heat sinks which are provided contacting at least a part of the light source units 20. The heat-radiating member 24 is made of a material whose coefficient of thermal conductivity is higher than air such as metal. The heat radiating members 24 are pivotally movable on the aiming mechanism, accompanying the light source units 20 within a range of the movement of the light source units 20, also having a sufficient space against the lamp body 14 to adjust the light axis of the light source units 20. The heat radiating members 24 may be integrally formed as a metal member. In this case, the entire heat radiating members 24 can dissipate heat efficiently.

The extension reflector 28 is made of a thin metal plate, reaching the cover 12 from the bottoms of the light source units 20. The extension reflector 28 covers at least a part of an inner surface of the lamp body 14 so as to conceal the inner surface of the lamp body 14, thereby improving the appearance of the vehicular lamp 10.

At least a part of the extension reflector 28 touches the light source units 20 and/or the heat radiating members 24. In this case, the extension reflector 28 functions as a heat conducting member for conducting the heat produced by the LED module 100 to the cover 12. Accordingly, the extension reflector 28 dissipates the heat of the LED module 100. And a part of the extension reflector 28 is fixed to the cover 12 or the lamp body 14. The extension reflector 28 may be shaped to cover the top, bottom, and sides of the light source units 20.

According to this embodiment, using the LED module 100 as the light source, the light source units 20 can be small. In addition, thanks to this, the degree of freedom for arrangement of the light source units 20 is improved, so it is possible to provide the vehicular lamp 10 of good characteristics for design.

Figure 3:
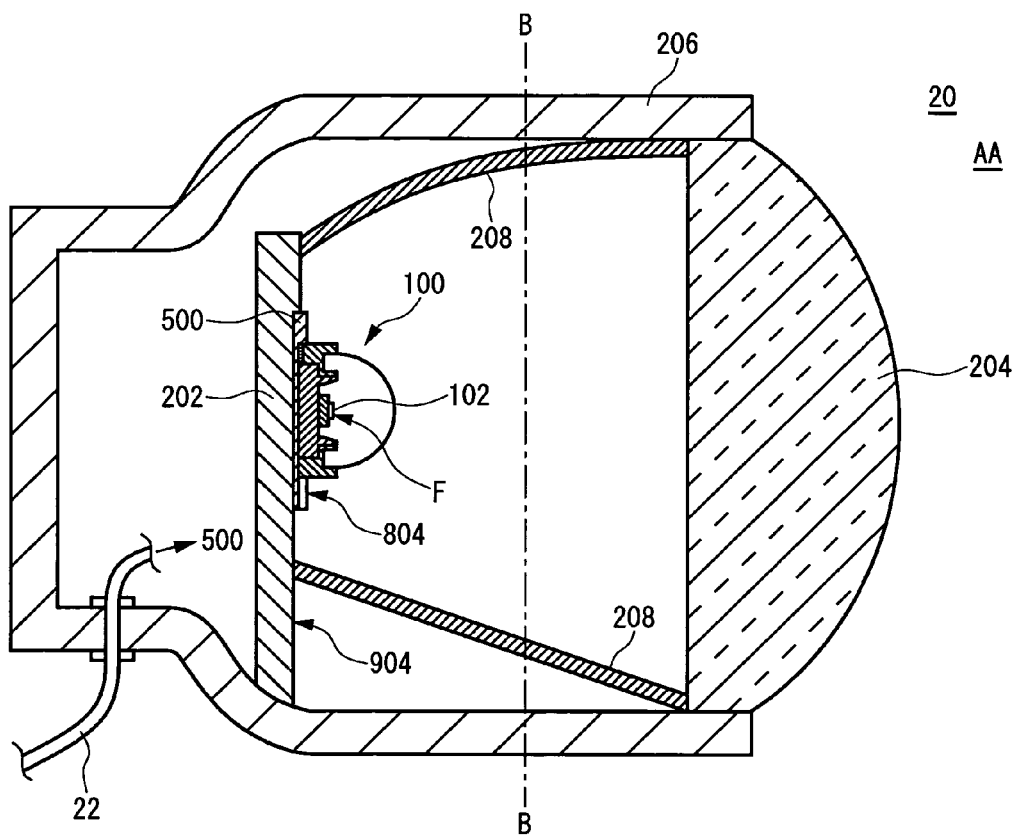
FIG. 3 is a vertically sectional view AA of a light source unit.
Figure 4:
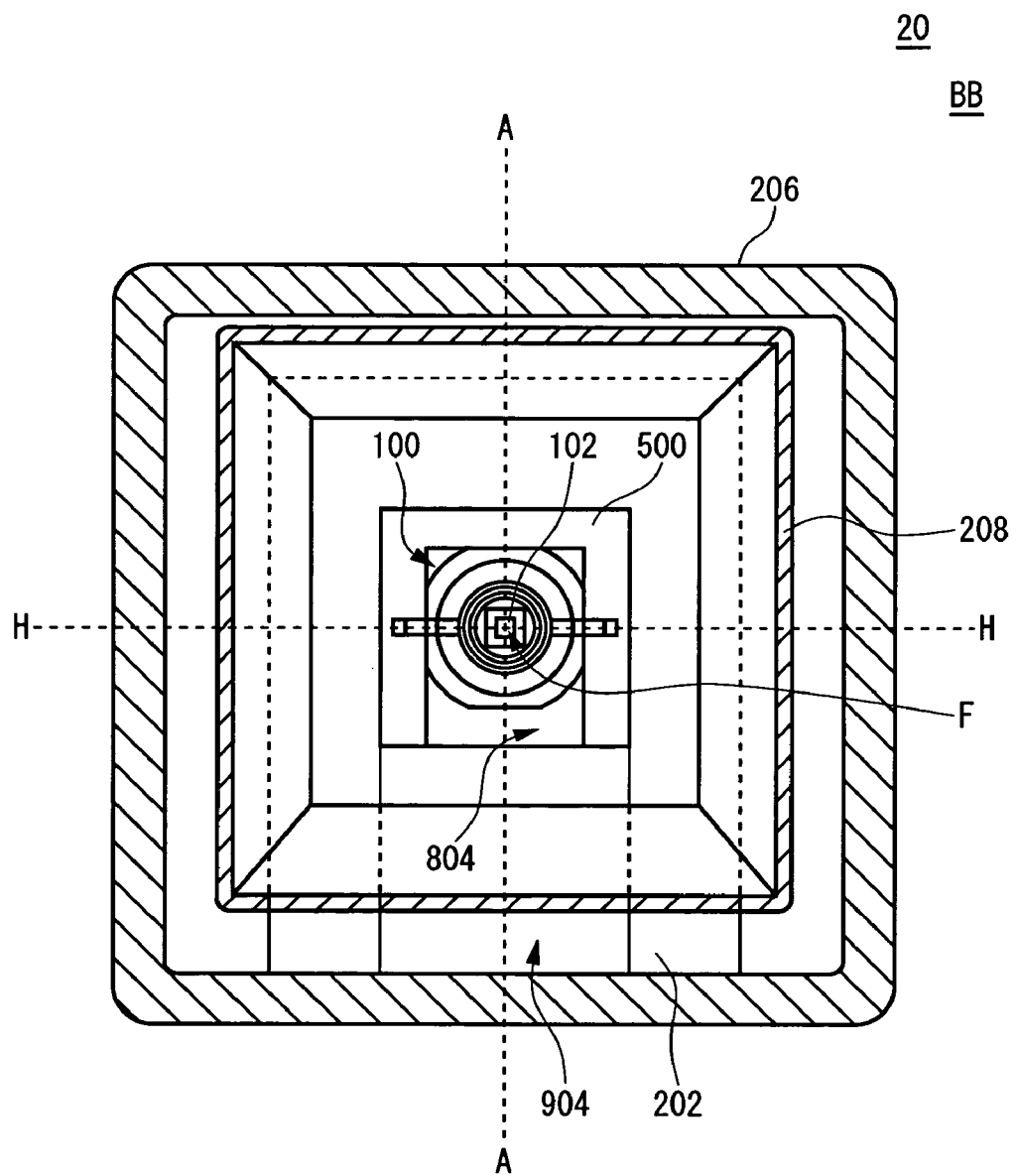
FIG. 4 is a vertically sectional view BB of the light source unit.

FIGS. 3 and 4 show an embodiment of the configuration of the light source unit 20. FIG. 3 shows a vertically sectional view AA of a light source unit 20. FIG. 4 shows a vertically sectional view BB of the light source unit 20. The light source unit 20 is a straight emission type light source unit for emitting the light generated by the LED module 100 in the forward direction of the automobile, including a LED module 100, substrate 500, a fixing member 202, a lens 204, an extension 208, and a housing 206.

The LED module 100 is an example of light source module for generating light. LED module 100 is a light source for emitting a white light, for example, including a semiconductor light-emitting element 102. The semiconductor light-emitting element 102 generates light based on the power received from the outside of the light source unit 20 via the cable 22 and the substrate 500. Moreover, the semiconductor light-emitting element 102 generates light from a lighting region predetermined, for example its entire surface facing the lens 204.

The substrate 500 connects the LED module 100 and the cable 22 with a printed wiring which is formed on the surface of the substrate 500 or inside of the substrate 500, for example. According to the present embodiment, substrate 500 is shaped like a plate for fixing the LED module 100 mounting the LED module, including a groove 804. The groove 804 accommodates a part of the LED module 100, thereby fixing the LED module 100 to a predetermined reference position. For example, the groove 804 allows the inner wall of the groove 804 to come into contact with a part of the outer surface of the LED module 100 so as to fix the LED module 100. Thus, according to the present embodiment, the substrate 500 can fix the LED module 100 with a high accuracy. The groove 804 is an example of the light source fixing member for fixing the LED module 100.

According to the present embodiment, at least one of the parts of the substrate 500 is made of a material whose coefficient of thermal conductivity is higher than air such as metal. At least the part of the substrate 500 contacts the fixing member 202. Thus, the substrate 500 conducts the heat produced by the LED module 100 to the fixing member 202.

The fixing member 202 is shaped like a plate whose surface faces in the forward direction of the automobile. The fixing member 202 is provided at a position a relative position of which with respect to the lens 204 is predetermined. The fixing member 202 fixes the substrate 500 on its surface, interposed between the fixing member 202 and the LED module 100. Thus, the fixing member fixes the LED module 100 in the forward direction of the automobile and makes the LED module 100 emit light in the forward direction of the automobile.

The fixing member 202 includes a groove 904. The groove 904 accommodates a part of the substrate 500 so as to fix the substrate 500 to a predetermined reference position. For example, the groove 904 allows the inner wall of the groove 904 to come into contact with the part of the substrate 500 so as to fix the substrate 500. Thus According to the present embodiment, the fixing member 202 can fix the substrate 500 with a high accuracy.

And the fixing member 202 is made of a material whose coefficient of thermal conductivity is higher than air such as metal, functioning as a radiating plate for dissipating the heat produced by the LED module 100. According to the present embodiment, the fixing member 202 is touching the housing 206 at its one end, so that it conducts the heat produced by the LED module 100 to the housing 206, thereby dissipating the heat of the LED module 100. Accordingly, it is possible to prevent the amount of the light emitted by the LED module 100 from being reduced by the heat.

The extension 208 is made of a thin metal plate, extending from the vicinity of the LED module 100 to the vicinity of an edge section of the lens 204. Accordingly, the extension 208 conceals the gap between an inner surface of the housing 206 and the LED module 100 so as to improve the appearance of the vehicular lamp 10 (see FIG. 1). The extension 208 may reflect the light produced by the LED module 100.

The housing 206 is shaped like a box for containing the LED module 100, the substrate 500, the fixing member 202, and the extension 208. And the housing 206 has an opening in its front face, in which the lens 204 is held. The housing 206 may conduct the heat received from the LED module 100 via the substrate 500 and the fixing member 202 to the heat radiating members 24 (see FIG. 1) and/or the extension reflector 28 (see FIG. 1). Accordingly, it is possible to properly dissipate the heat of the LED module 100.

The lens 204 is an exemplary optical member used in the vehicular lamp 10 (see FIG. 1). The lens 204 forms at least a part of a light distribution pattern by projecting the shape of the lighting region of the semiconductor light-emitting element 102 in the forward direction of the automobile. According to the present embodiment, the lens 204 has a focus F at a center of the lighting region. The lens 204 projects the shape of the lighting region to a position where a hot zone (a high luminance region) is to be formed. The lens 204 may emit light generated by the LED module 100 to the outside of the vehicular lamp 10.

According to the present embodiment, the fixing member 202 is provided at a position a relative position of which with respect to the lens 204 is predetermined and fixes the substrate 500 to the position by the groove 904 with high accuracy. Moreover, the substrate 500 fixes the LED module 100 to a predetermined position by the groove 904 with high accuracy. Accordingly the substrate 500 fixes the LED module 100 to a reference position a relative of which with respect to the lens 204 is predetermined. Thus, According to the present embodiment, it is possible to fix the LED module 100 to the lens 204 with high accuracy. Thus the light distribution pattern can be formed properly with high accuracy. Moreover, the focus F is an example of an optical center used for the light source units 20. The optical center is an example of a reference point in optical member design. In an alternative embodiment, the substrate 500 and the fixing member 202 may be made of a material and combined as one structure.

Figure 5:
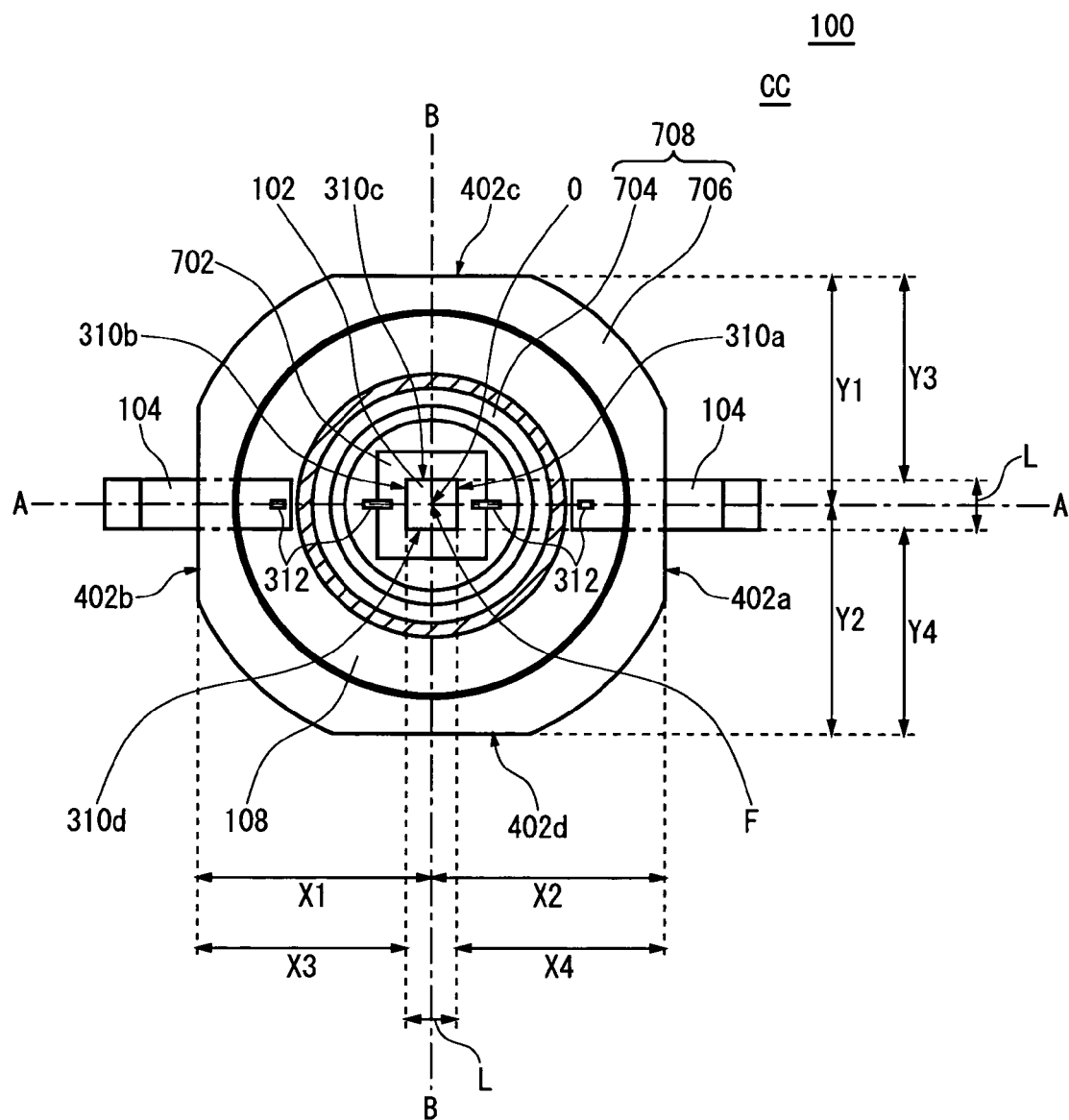
FIG. 5 is a C—C cross-section of the LED module.
Figure 6:
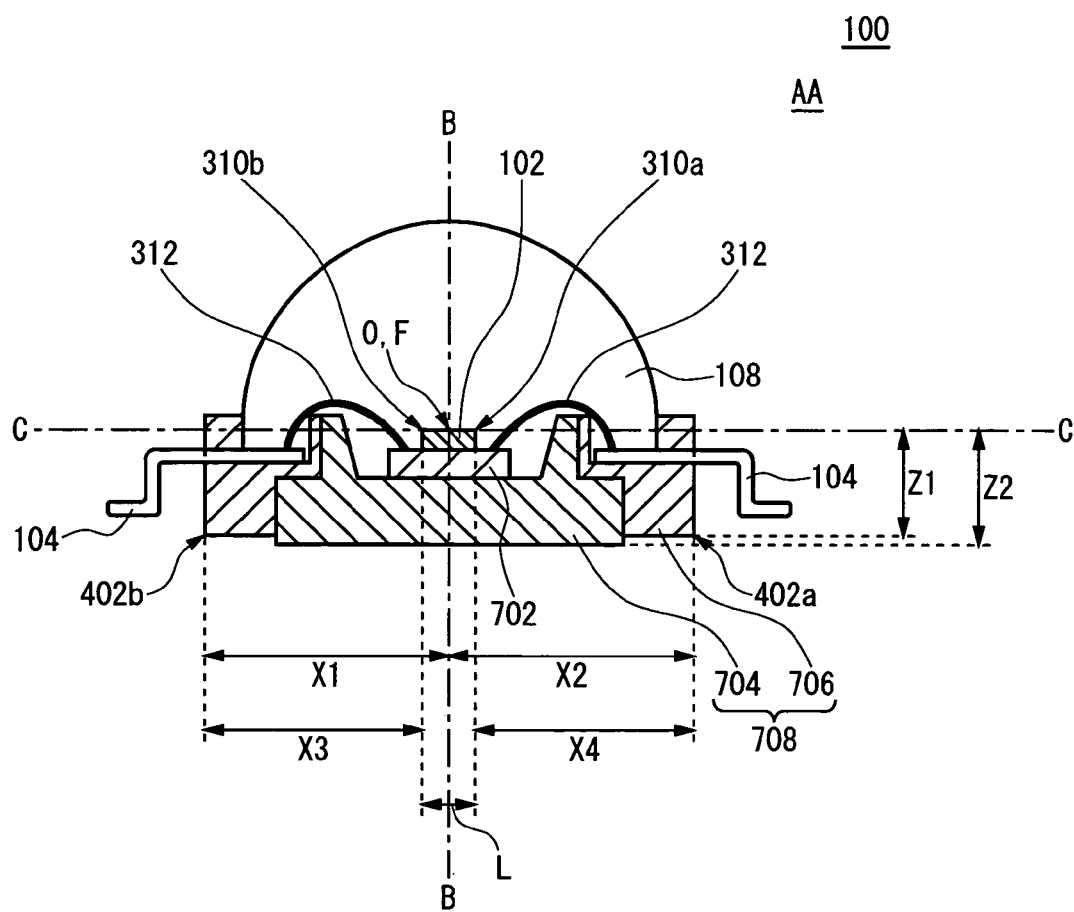
FIG. 6 is an A—A cross-section of the LED module.
Figure 7:
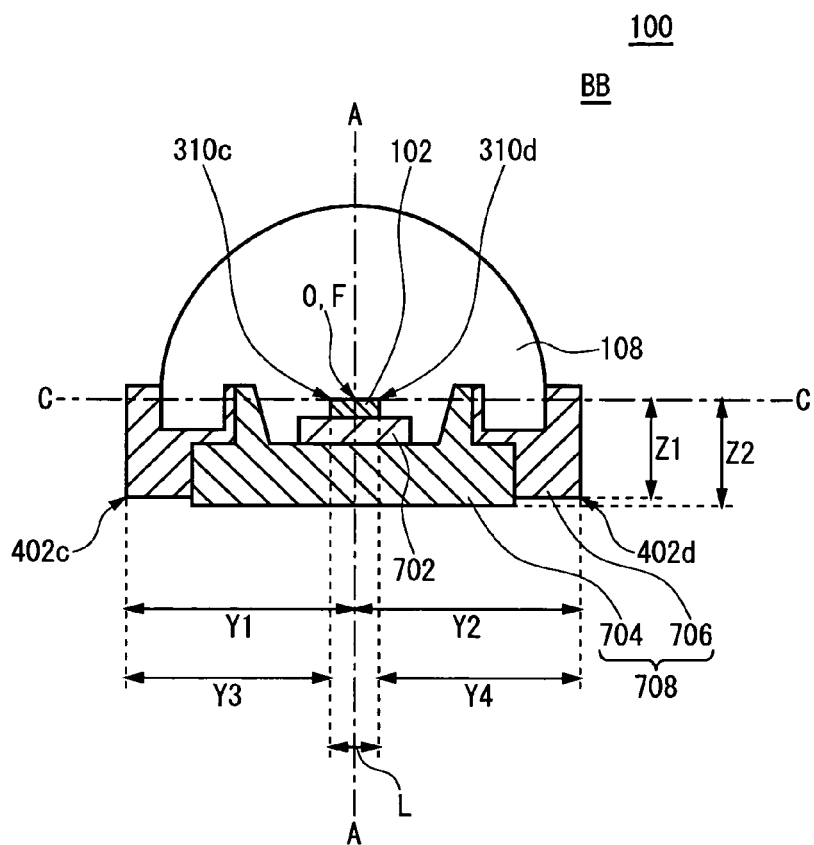
FIG. 7 is a B—B cross-section of the LED module.

FIGS. 5, 6, and 7 show a structure of the LED module 100. FIG. 5 shows a C—C cross-section of the LED module 100. FIG. 6 shows an A—A cross-section of the LED module 100. FIG. 7 shows a B—B cross-section of the LED module 100. LED module 100 includes the semiconductor light-emitting element 102, a sealing member 108, a plurality of electrodes 104, a sub mount 702, bonding wire 312, and a holding member 708.

The semiconductor light-emitting element 102 is a light emitting diode element. The semiconductor light-emitting element 102 emits blue light towards a fluorescent material provided on its surface, thereby allowing the fluorescent material to emit yellow light which is complementary to the blue light. In this case, the LED module 100 produces white light based on the blue and yellow light produced by the semiconductor light-emitting element 102 and the fluorescent material respectively. According to another embodiment, the semiconductor light-emitting element 102 may emit infrared light to the fluorescent material so as to allow the fluorescent material to emit the white light.

According to the present embodiment, the semiconductor light-emitting element 102 emits light from a surface which faces the sealing member 108. This face faces the lens 204 (see FIG. 3) when the LED module 100 is fixed to the light source unit 20 (see FIG. 3). The semiconductor light-emitting element 102 emits light from its approximate entire surface as a lighting region. The semiconductor light-emitting element 102 is an example of a flat source for generating light from a flat area with expansion.

According to the present embodiment, the lighting region of the semiconductor light-emitting element 102 is an approximate square area surrounded by four straight sides 310a–310d. The sides 310a–310d are on a surface which faces the sealing member 108 of the semiconductor light-emitting element 102. Each of the sides 310a–310d may be a side a relative position of which with respect to the center O of the lighting region is predetermined. Moreover, the distance L of each side 310 may be about 1 mm. According to the present embodiment, the lens 204 has a focus F on the center O of this lighting region. In this case, the lens 204 can project the shape of the lighting region with high accuracy. Further, the semiconductor light-emitting element 102 may also emit light from an end surface which continues to the surface of the semiconductor light-emitting element 102 and is imposed among the sides 310a–310d, for example.

Here, the center O is defined as a center of a symmetrical property of the shape of the lighting region. The center O may be a gravity point of the approximate square area surrounded by the four sides 310a–310d or a circumcircle of the square area. The center O may be a point on a perpendicular bisector of any sides 310. The lens 204 forms the light distribution pattern based on the shape of the lighting region symmetrical to the center O. In this case, the light distribution pattern has a symmetrical property which corresponds to the symmetrical property of the shape of the lighting region.

The sealing member 108 is a mold for sealing the semiconductor light-emitting element 102 and the sealing member 108 is made of a material through which the white light produced by the semiconductor light-emitting element 102 passes such as translucent resin. According to the present embodiment, at least a part of the sealing member 108 is hemispherical. In this case, LED module 100 has an optical axis which runs through the center of this hemispheroid and is also vertical to the surface of the semiconductor light-emitting element 102.

The electrodes 104 are electrically connected to the substrate 500 (see FIG. 3) and supply a power supplied from the outside of the light source 20 via the substrate 500 and the cable 22 (see FIG. 3), to the semiconductor light-emitting element 102 via the bonding wire 312 and the sub mount 702. The bonding wires 312 connect the electrodes 104 and sub mount 702 electrically.

The sub mount 702 is a plate like member made of silicon, for example, and fixes the semiconductor light-emitting element 102 mounting on the surface. The sub mount 702 has a wiring that electrically connects the bonding wire 312 and the semiconductor light-emitting element 102 and supplies a power received from the outside of the LED module 100 via the bonding wire 312, to the semiconductor light-emitting element 102.

The holding member 708 has a slag 704 and a body 706. The slag 704 fixes the sub mount 702 by mounting on the surface, thereby fixing the semiconductor light-emitting element 102 to the predetermined position. The slag 704 fixes the semiconductor light-emitting element 102 in such a manner that the center O of the lighting region fits the optical axis of the LED module 100. At least one of the part of the slag 704 is made of a material whose coefficient of thermal conductivity is higher than air such as metal and conducts the heat produced by the LED module 100 to the outside of the LED module 100.

The body 706 is made of a resin or like to cover the circumference of the slag 704. The body 706 accommodates each part of the electrodes 104, thereby fixing the electrodes 104.

According to the present embodiment, the body 706 has a plurality of sides 402a–402d. Each of the sides 402a–402d is an example of the reference member which indicates the position of the semiconductor light-emitting element 102. At least a part of the sides 402a–402d may be one of the sides of the holding member 708. At least a part of the sides 402a–402d is fixed by fitting the reference point of the substrate 500 when the LED module 100 is fixed to the substrate 500.

And the body 706 is provided to be fixed to the slag 704. Accordingly the holding member 708 fits the center O of the semiconductor light-emitting element 102 to a position a relative position of which with respect to the side 402a–402d is predetermined, so as to hold the semiconductor light-emitting element 102. In this case, the sides 402a–402d are such sides relative positions of which with respect to the center O are predetermined. According to another embodiment, the holding member 708 fits any of the sides 310a–310d to the positions a relative position of which with respect to any of the sides 402a–402d are predetermined, so as to hold the semiconductor light-emitting element 102. In this case, the sides 402a–402d are such sides relative positions of which with respect to the center O are predetermined because the relative positions from the sides 310a–310d to the center O are predetermined.

According to the present embodiment, it is possible to fix the center O of the lighting region to the reference position with high accuracy by fixing the LED module 100 regarding at least a part of the side 402a–402d as the reference position. As is explained using the FIGS. 3 and 4, According to the present embodiment, the LED module 100 is accurately fixed to the reference position the relative position of which with respect to the lens 204 is predetermined. Thus, According to the present embodiment, it is possible to align and fix the center O of the lighting region to the lens 204 with high accuracy. According to the present embodiment, the light distribution pattern can be formed properly.

Next, the measurement of the LED module 100 is described in further detail. According to the present embodiment, the holding member 708 fixes the semiconductor light-emitting element 102 on the sub mount 702 with reference to the position of the center O of the lighting region. The semiconductor light-emitting element 102 is provided on the slag 704 and sub mount 702, using an image processing technology which detects the relative position to the slag 704. Thus, it is possible to align and fix the side 310a of the semiconductor light-emitting element 102.

The holding member 708 fixes the semiconductor light-emitting element 102 in such a manner that the distance between the center O and the side 402c is equal to the distance Y1. Here, the distance between the center O and the side 402c is, for example, defined as the distance between each projected images when the center O and the side 402c are projected on the plane parallel to the surface of the semiconductor light-emitting element 102.

It is preferred that the holding member 708 fits the distance between the center O and side 402c so as to fix the semiconductor light-emitting element 102 with the accuracy of which the position error is less than the distance corresponding to 5 percent of the distance L defined as the distance of one side of the semiconductor light-emitting element 102. In this case, it is possible to form the cut line properly. It is further preferred that the holding member 708 fixes the semiconductor light-emitting element 102 with the accuracy of which the position error is less than the distance corresponding to 1 percent of the distance L. In this case, it is possible to form the cut line more properly. The holding member may fix the side 310a the semiconductor light-emitting element 102 with the accuracy of the position error whose value is less than 0.01 mm.

According to another embodiment, the holding member 708 may fix the semiconductor light-emitting element 102 in such a manner that the distance between the center O and the side 402d is equal to the distance Y2. Further, the holding member 708 may fix the semiconductor light-emitting element 102 in such a manner that the distance between any one of the side 310c–d and any one of the side 402c–d is equal to the distance Y3 or Y4. In this case, the semiconductor light-emitting element 102 can be also fixed, fitting the center O to a predetermined position. Further, the side 310c is an opposite side of the side 310d which is on the surface of the semiconductor light-emitting element 102. The side 402c is opposed to the side 402d, with the semiconductor light-emitting element 102 interposed therebetween.

Further, according to the present embodiment, the holding member fixes the semiconductor light-emitting element 102 in such a manner that the distance between the center O and the side 402b is equal to the predetermined distance X1. According to another embodiment, the holding member may fix the semiconductor light-emitting element 102 in such a manner that the distance between the center O and the side 402a is equal to the predetermined distance X2. The holding member 708 may fix the semiconductor light-emitting element 102 in such a manner that the distance between any one of the side 310b–a and any one of the side 402b–a is equal to the distance X3 or X4.

The holding member 708 fixes the semiconductor light-emitting element 102 in such a manner that the distance between the surface of the semiconductor light-emitting element 102 and a bottom surface of the body 706 is equal to the predetermined distance Z1. For example, the bottom surface of the body 706 is defined as the plane which includes at least a part of the sides 412a–412d and is parallel to the surface of the semiconductor light-emitting element 102. According to another embodiment, the holding member 708 may fix the semiconductor light-emitting element 102 in such a manner that the distance between the surface of the semiconductor light-emitting element 102 and bottom surface of the slag 704 is equal to the predetermined distance Z2. According to the present embodiment, it is possible to fix the semiconductor light-emitting element 102 with a high accuracy.

Figure 8:
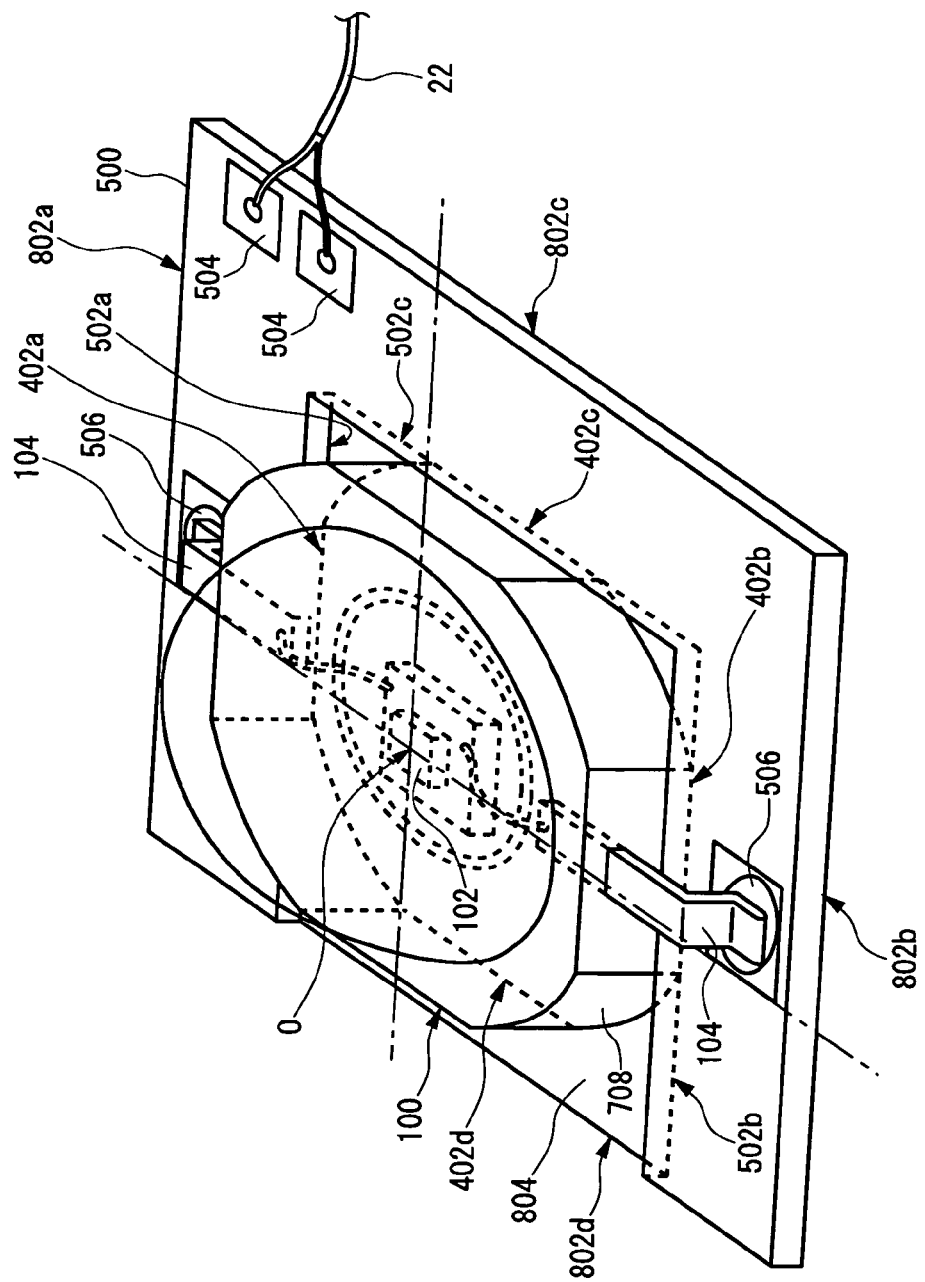
FIG. 8 shows an exemplary structure of the substrate.

FIG. 8 shows an exemplary structure of the substrate 500 with the LED module 100. According to the present embodiment, the substrate 500 includes a plurality of pads 504, a plurality of pads 506, and groove 804.

The pads 506 are connected to the electrodes 104 of the LED module 100 by soldering for example. The pads 504 are connected to the cable 22 by soldering and also connected electrically to the pads 506 via a printed wiring formed on the surface or the inside of the substrate 500. Thus the substrate 500 connects the cable 22 and the LED module 100 electrically.

The groove 804 accommodates a part of the holding member 708, thereby fixing the LED module 100. According to the present embodiment, the groove 804 includes a plurality of sides 502a–c. Each of the sides 502a–c is an example of a reference side which indicates the reference position where the LED module 100 is to be fitted. The groove 804 allows the outside face of the holding member 708 including the side 402a–c to come contact with the faces of the inside walls including the side 502a–c, thereby fixing the LED module 100 to the reference position. The substrate 500 may fix the LED module 100 by fitting the sides 402a–c to the reference position. According to the present embodiment, it is possible to fix the LED module 100 with high accuracy. Thus, it is possible to fix the semiconductor light-emitting element 102 with high accuracy.

The substrate 500 includes sides 802a–802d in the side face of the substrate 500, and is fixed to the fixing member 202 (see FIG. 3) regarding at least apart of the sides 802a–802d as a reference. For example, the fixing member 202 allows the side faces of the substrate 500 including the side 802a–c to come contact with the face of inside wall of the groove 904 (see FIG. 3), thereby fixing the substrate 500. In this case, the fixing member can fix the substrate 500 with high accuracy. Thus, According to the present embodiment, it is possible to fix the LED module 100 with high accuracy to the reference position the relative position of which with respect to the lens 204 (see FIG. 3) is predetermined, for example. Accordingly, the vehicular lamp 10 (see FIG. 1) can form the light distribution pattern properly.

Figure 9:
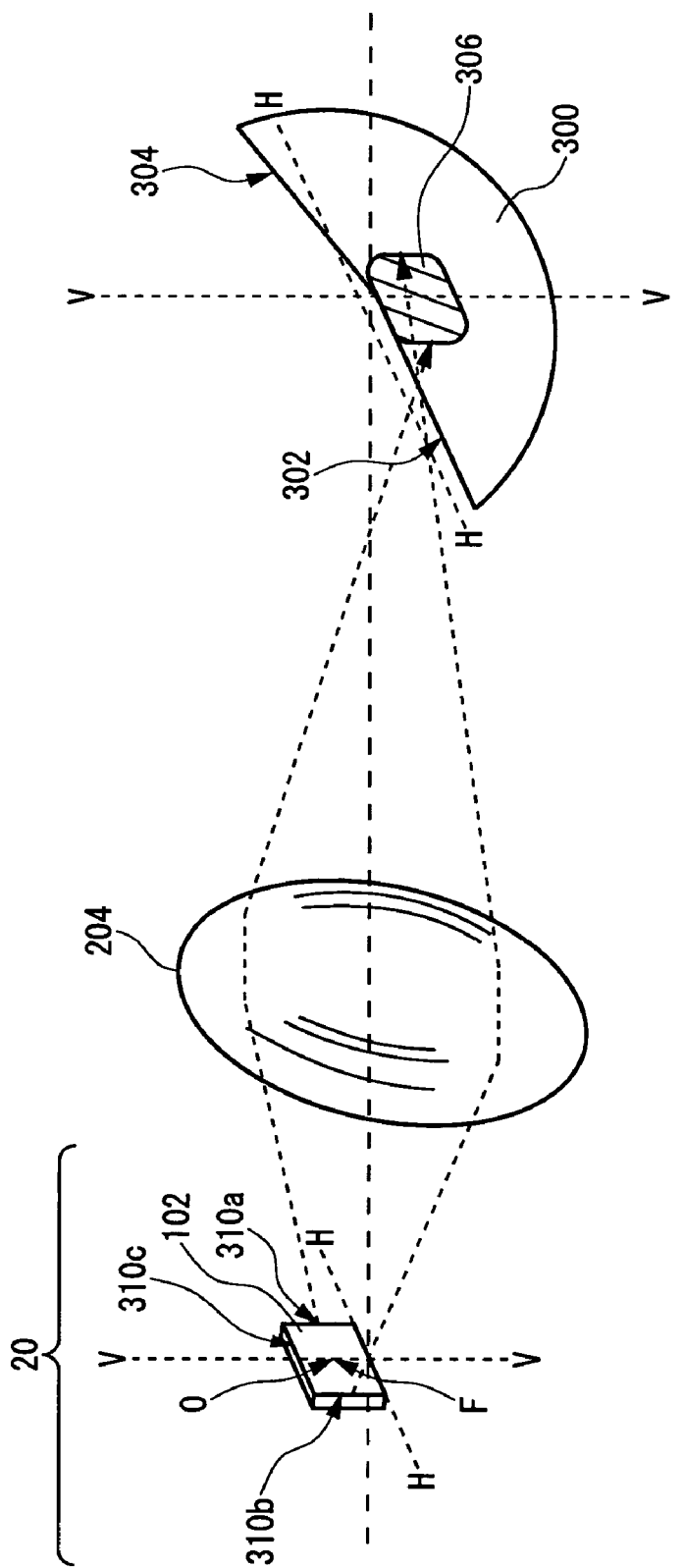
FIG. 9 shows an example of a light distribution pattern.

FIG. 9 shows an example of a light distribution pattern 300 formed by the vehicular lamp 10 (see FIG. 1). The light distribution pattern 300 is a low beam light distribution pattern which is formed on a vertically virtual screen disposed 25m away from the front of the vehicular lamp 10. According to the present embodiment, the vehicular lamp 10 forms the light distribution pattern 300 having a the horizontal cut line 302 which determines the boundary between bright and dark in an approximately horizontal direction and an oblique cut line 304 which determines the boundary between bright and dark in an oblique direction by 15 degree against the horizontal direction.

According to the present embodiment, the vehicular lamp 10 includes the plurality of light source units 20 whose light distribution characteristics are different from each other, forming the light distribution pattern 300 based on the light produced by each of the light source units 20. In this case, each of the light source units 20 forms a partial area of the light distribution pattern 300. For example, the light source unit 20 described in connection with FIGS. 3 and 4 forms a partial area 306 of the light distribution pattern 300.

Hereafter, the light distribution characteristics of the light source units 20 described in connection with FIGS. 3 and 4 will be described in detail. According to the present embodiment, the lens 204 of the light source units 20 has a focus F on the center O at the lighting region of the semiconductor light-emitting element 102. Thus, the lens 204 projects the shape of the lighting region of the semiconductor light emitting element 102 in the forward direction of the automobile by emitting light generated by the semiconductor light emitting element 102 forward, thereby forming the area 306. The lens 204 forms the area 306 at the position where the hot zone is to be formed in the light distribution pattern 300.

Here, the LED module 100 is fixed with high accuracy to the predetermined position by the side 402 (see FIG. 8) that has already aligned to the center O at the lighting region of the semiconductor light-emitting element 102. Therefore, the center O is aligned with high accuracy to the lens 204. In this case, the lens 204 can project the shape of the lighting region to the area 306 with high accuracy. The structure according to the present embodiment is capable of forming the light distribution pattern properly.

Further, According to another embodiment, the lens 204 may form the area 306 in such a manner that an edge of the area 306 coincides with a horizontal cut line 302 or an oblique cut line 304. In this case, the lens 204 may form the horizontal cut line 302 or the oblique cut line 304 based on the edge shape of the lighting region in the semiconductor light-emitting element 102. The lens 204 may form the area 306 in such a manner that a part of the edge of the area 306 coincides with the part of the horizontal cut line 302 or the part of the oblique cut line 304.

Figure 10:
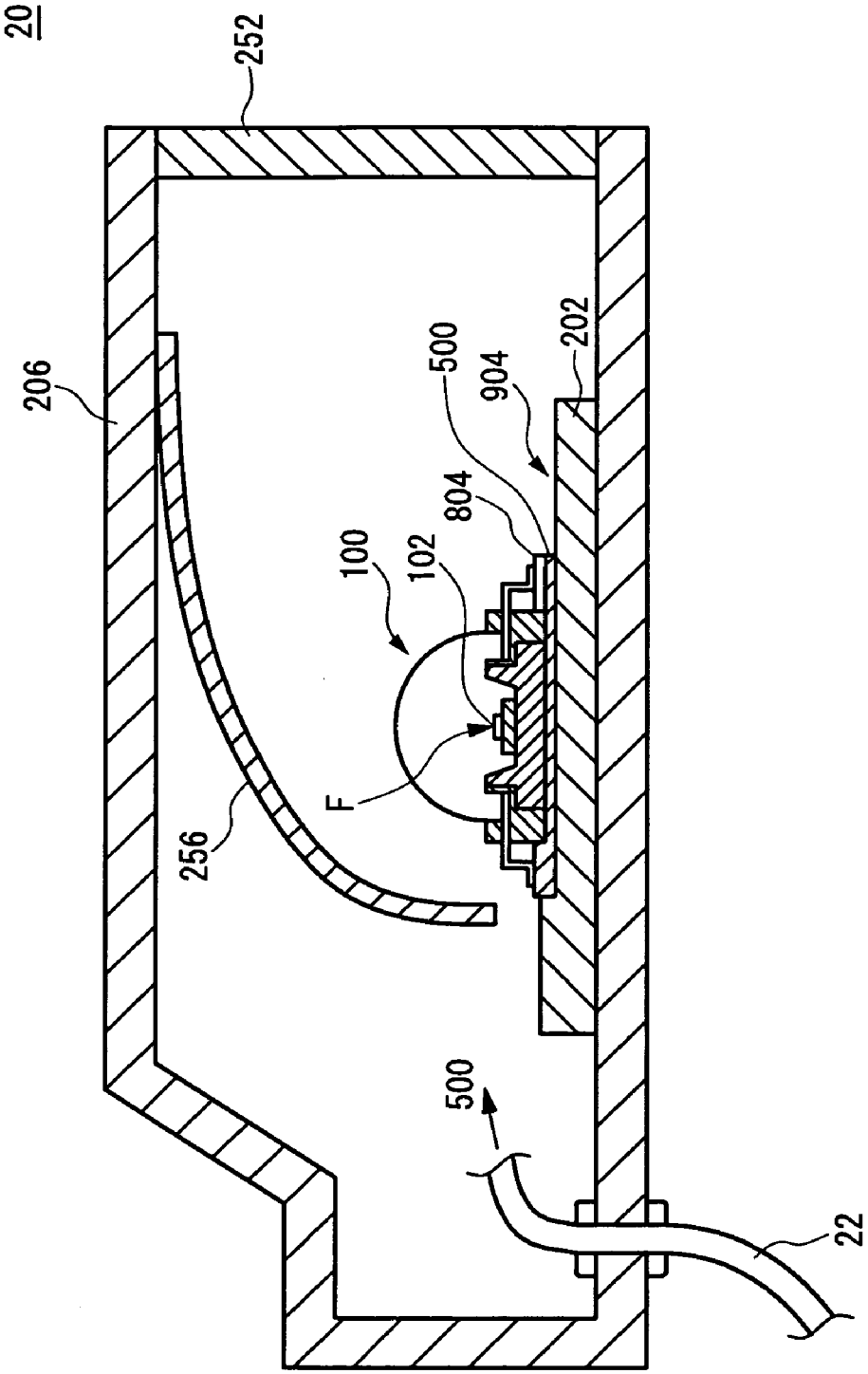
FIG. 10 shows a vertically sectional view of the light source unit.

FIG. 10 shows a vertically sectional view of another light source unit 20. Further, matters in FIG. 10 given the same symbols as those in FIGS. 3 and/or 4 except the points to be described later will not be described because they have the same or similar functions as those in FIGS. 3 and/or 4.

According to the present embodiment, the light source unit 20 includes a cover 252, a LED module 100, a substrate 500a, a fixing member 202, a reflector 256 and a hosing 206. The cover 252 is made of a material through which the light produced by the semiconductor light emitting element 102 can pass, translucently formed on the front surfaces of the light source units 20.

The fixing member 202 is mounted on the bottom surface of the light source unit 20, facing its surface upward. The fixing member 202 is fixed to a position a relative position of which with respect to the reflector 256 is predetermined.

Moreover, the fixing member 202 fixes the substrate 500 by the groove 904 provided on the top surface. Thus, the substrate 500 fixes the LED module 100 to a reference position a relative position of which with respect to the reflector 256 is predetermined.

Here, the reference position is provided in advance at a position a relative position of which with respect to the optical center Fa of the reflector 256 is predetermined, for example. The optical center Fa is a reference point in designing the reflector 256. According to the present embodiment, the substrate 500 matches the center of the lighting region of the semiconductor light emitting element 102 and the optical center F, so as to fix the LED module 100.

The reflector 256 is formed to cover the corresponding LED module 100 from the back of the automobile. The reflector 256 reflects the light generated by the semiconductor light-emitting element 102 in the forward direction of the automobile, thereby forming at least a part of the light distribution pattern of the vehicular lamp 10 (see FIG. 1). The reflector 256 is an example of optical members used in the vehicular lamp 10.

Further, at least a part of the reflector 256 is formed, e.g. like a plane of a parabolic revolution. Some parts of this parabolic revolution reflect the incident light from the optical center F as a straight beam in the forward direction of the automobile. The reflector 256 may reflect the reflecting light as a diffuse light so as to form the light distribution pattern. The reflector 256 may emit the reflecting light to the hot zone.

Figure 11:
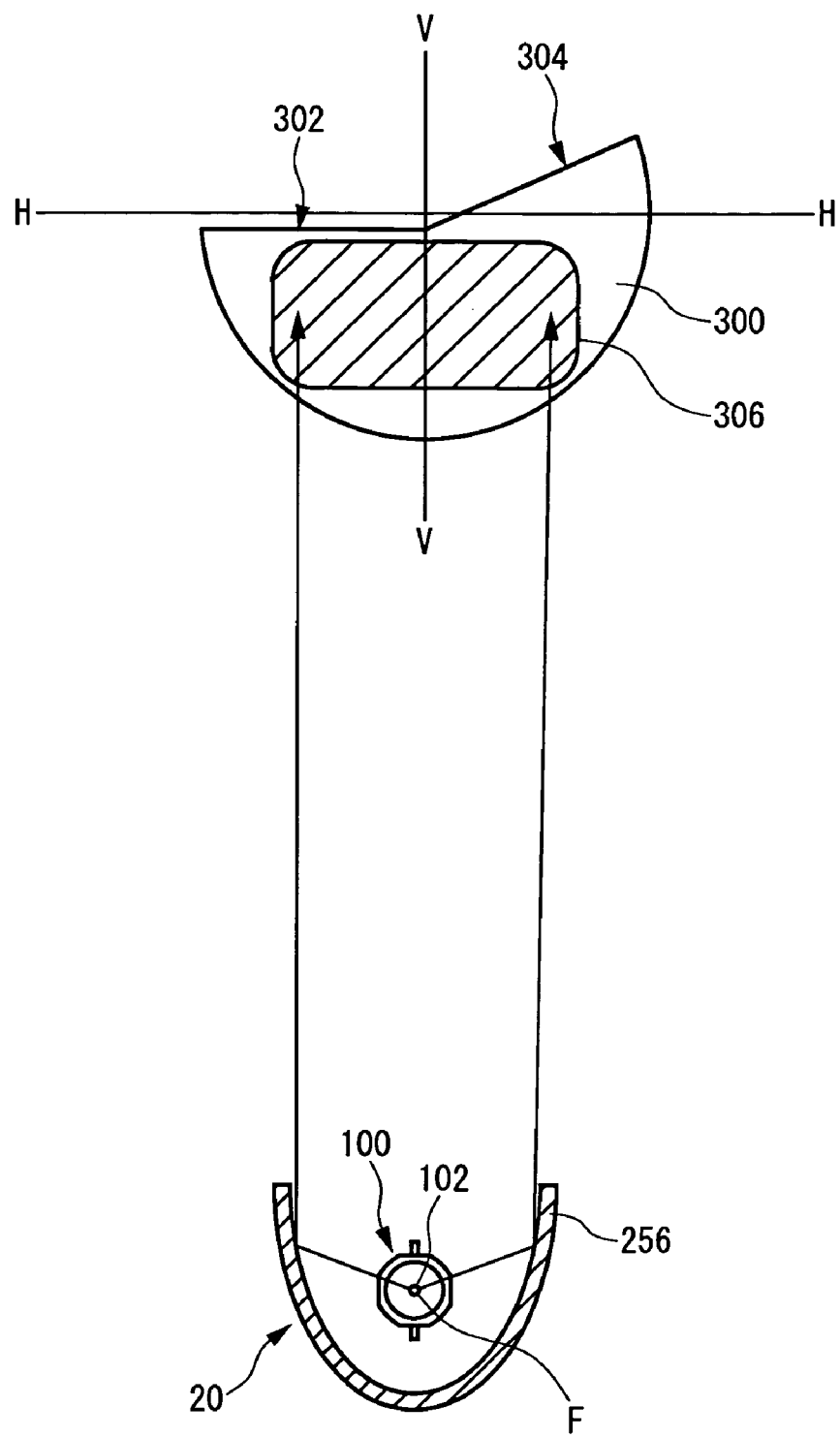
FIG. 11 shows an example of a light distribution pattern.

FIG. 11 shows an example of a light distribution pattern 300. Further, matters in FIG. 11 given the same symbols as those in FIG. 9 except the points to be described later will not be described because they have the same or similar functions as those in FIG. 9. According to the present embodiment, the vehicular lamp 10 (see FIG. 1) forms the light distribution pattern 300. The light source 20 explained in FIG. 10 forms area 306, which is a part of the light distribution pattern 300. The light source 20 forms the area 306 below the horizontal cut line 302 and the oblique cut line 304.

Here, the if the accuracy for fixing the LED module 100 is not enough, the light source 20 might form a part of the area 306 above the horizontal cut line 302 or the oblique cut line 304. In this case, the horizontal cut line 302 or the oblique cut line 304 becomes unclear and thus, the vehicular lamp 10 cannot form the light distribution pattern 300 properly, in some cases.

However, According to the present embodiment, the center at the lighting region of the semiconductor light-emitting element 102 and the optical center F are conformed, so as to fix the LED module 100. According to the present embodiment, the area 306 can be formed with high accuracy. And the light distribution pattern can be formed properly.

Figure 12A:
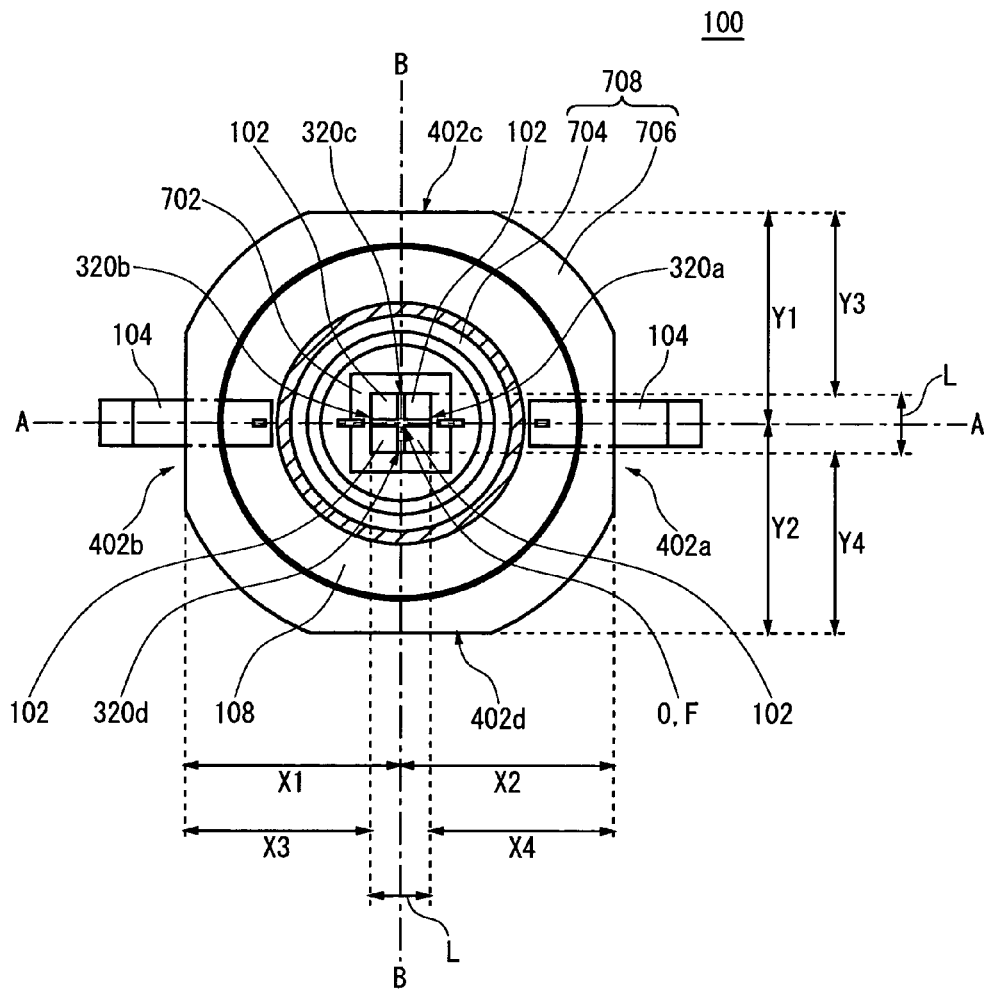
FIGS. 12A and 12B show another embodiment of structure of the LED module.
Figure 12B:
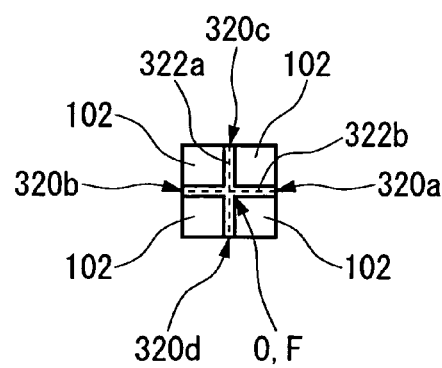

FIGS. 12A and 12B show another embodiment of structure of the LED module 100. Specifically, FIG. 12A shows a structure of the LED module 100. FIG. 12B shows a plurality of the semiconductor light emitting elements 102 in the LED module 100 in detail. Further, parts or components shown in FIGS. 12A and 12B given the same symbols as those in FIGS. 5, 6, and/or 7 except the points to be described later will not be described because they have the same or similar functions as those in FIGS. 5, 6 and/or 7. According to the present embodiment, the LED module 100 is used for the light source unit 20 explained in FIGS. 3 and 4. LED module 100 may be used for the light source unit 20 explained in FIG. 10.

According to the present embodiment, the LED module 100 includes a plurality of semiconductor light emitting elements 102. A plurality of semiconductor light-emitting elements 102 are positioned in order in an approximate square region surrounded by the imaginary line segment 320*a*–320*d*. Each of the line segments 320*a*–320*d* is, for example, a part of an envelope which includes each side of a plurality of the semiconductor light-emitting elements 102 which are adjoining each other.

The holding member 708 adjusts the distance between the center O at the lighting region of the semiconductor light emitting elements 102 and at least a part of a plurality of the sides 402*a*–402*d* so as to fix the semiconductor light emitting elements 102. The holding member 708 fixes the semiconductor light emitting elements 102 in such a manner that, for example, the distance between the center O and the side 402*d* is equal to the distance Y2. The holding member 708 may adjust the distance between the center O and any of the line segment 402*b*–*d* so as to fix the semiconductor light emitting elements 102. According to this case, a plurality of the semiconductor light emitting elements 102 can be fixed with high accuracy.

Further, the lighting region of the semiconductor light-emitting element 102 includes each lighting region of the semiconductor light-emitting elements 102, e.g. a region surrounded by the line segment 320*a*–320*d*. The center O of a plurality of the semiconductor light emitting elements 102 is defined as a center of a symmetrical property of the shape of the lighting region of the semiconductor light emitting elements 102. The center O may be a gravity point of this lighting region. In this case, the light source unit 20 (see FIG. 3) may project the shape of the lighting region symmetrical to the center O, so as to form at least a part of the light distribution pattern. In this case, a part of this light distribution pattern has a symmetrical property which corresponds to the symmetrical property of the shape of the lighting region.

In another embodiment, the center O may be a point which is on a line segment which expands among the semiconductor light emitting elements 102, e.g. line segments 322*a* or 322*b* drawing with dot lines in FIG. 12B. In this case, the light source unit 20 forms at least a part of the light distribution pattern based on the shape of the lighting region that is symmetrical with respect to the line segment 322.

According to the present embodiment, the lens 204 (see FIG. 3) has a focus F above the center O. In this case, the lens 204 can project the shape of the lighting region of a plurality of the semiconductor light emitting elements 102 in the forward direction of the automobile with high accuracy. Thus, the light distribution pattern can be formed properly.

Figure 13:
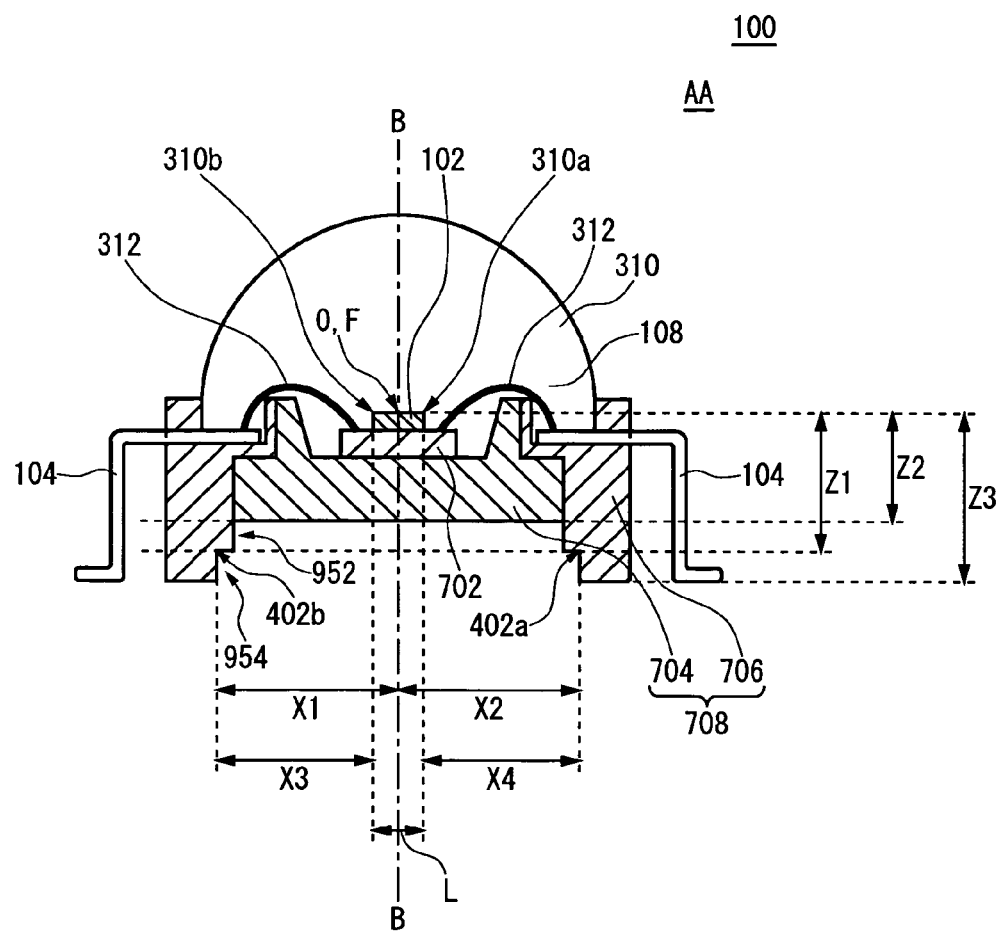
FIG. 13 shows an A—A cross-section of the LED module.
Figure 14:
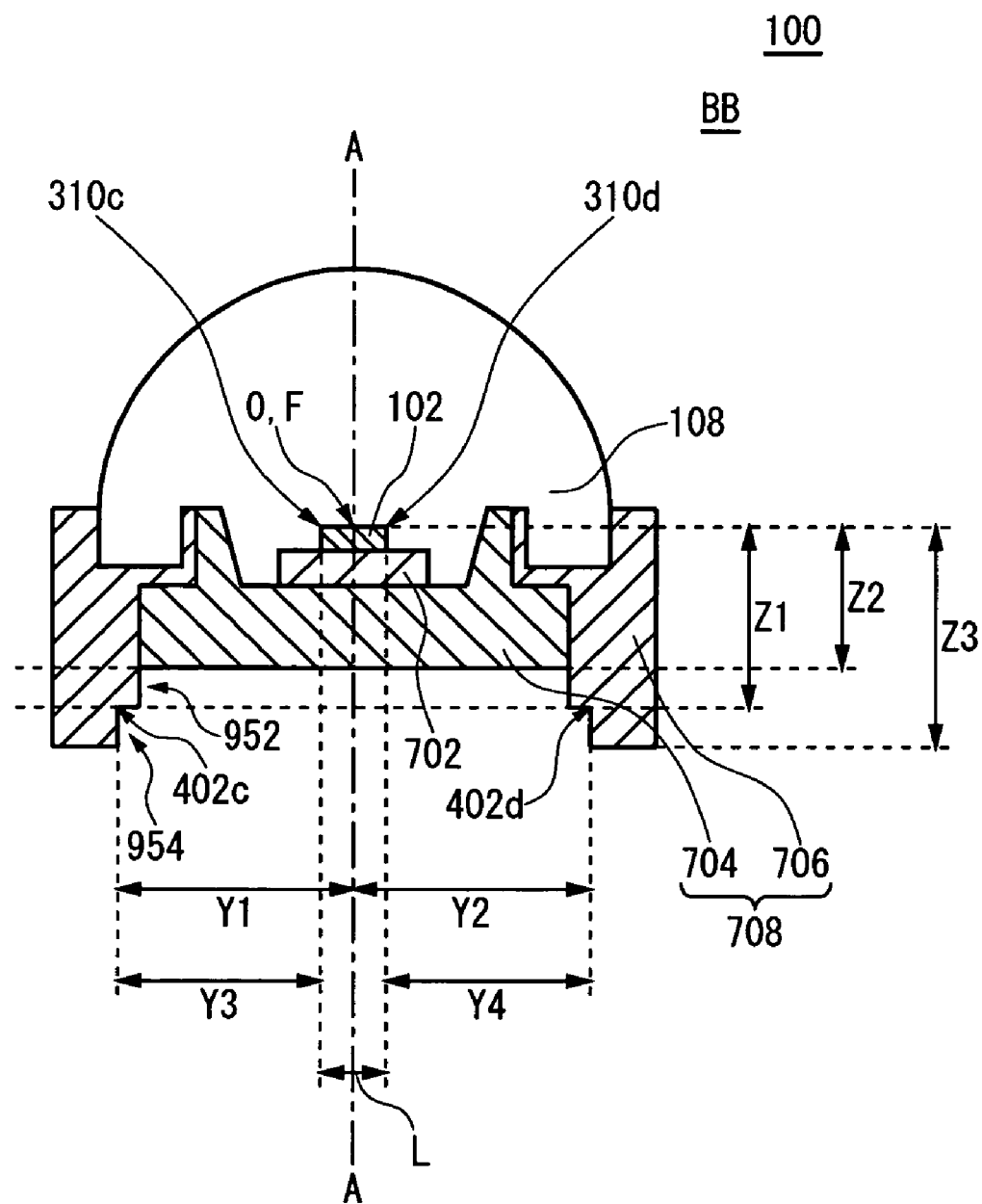
FIG. 14 shows a B—B cross-section of the LED module.
Figure 15:
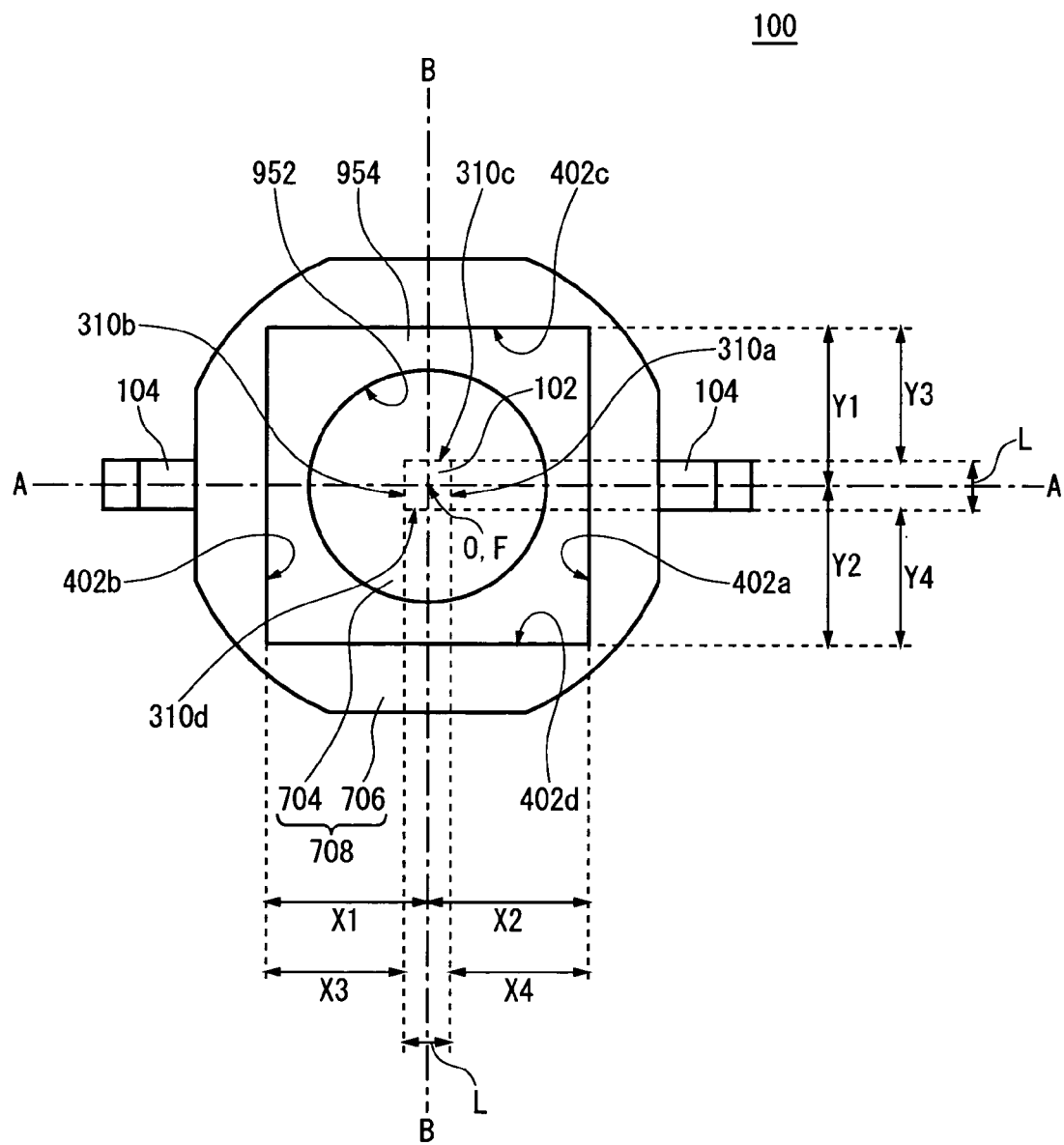
FIG. 15 shows a bottom view of the LED module.

FIGS. 13, 14 and 15 show another embodiment of structure of the LED module 100. FIG. 13 shows an A—A cross-section of the LED module 100. FIG. 14 shows a B—B cross-section of the LED module 100. FIG. 15 shows a bottom view of the LED module 100. Further, matters in FIGS. 13, 14 and 15 given the same symbols as those in FIGS. 5, 6 and/or 7 except the points to be described later will not be described because they have the same or similar functions as those in FIGS. 5, 6 and/or 7.

According to the present embodiment, the body 706 has a slug accommodating member 952 and expanding member 954. The slug accommodating member 952 is formed to cover the circumference of the slag 704. Thus, the slug accommodating member 952 accommodates and fixes the slug 704.

The expanding member 954 is formed expanding from the lower end of the slug accommodating member 952 in the lower direction. Here, for example, the lower direction is defined as the direction along an apex of the hemispherical sealing member 108 and the center of the hemispheroid. The expanding member 954 has an approximate square like hole, in its under surface, hollowed in the direction vertical to the surface of the semiconductor light emitting element 102. This hole has a plurality of sides 402a–402d in at least of apart of the surface of the inner wall. Each of sides 402a–402d is an example of the reference member indication the semiconductor light emitting element 102. The sides 402a–402d may be formed at the face of the inner wall of the holding member 708.

Further, the sides 402a–402d may be formed on a plane parallel to the surface of the semiconductor light emitting element 102. The slug accommodating member 952 and the expanding member 954 may be formed in such a manner that the plane corresponds to the boundary between them.

According to the present embodiment, the holding member 708, for example, fits the center O at the lighting region of the semiconductor light emitting element 102 to a position relative positions of which with respect to the sides 402a–402d are predetermined, so as to fix the semiconductor light-emitting element 102. For example, the holding member 708 fixes the semiconductor light emitting element 102 in such a manner that the distance between the center O and the side 402d is equal to the distance Y2 and the distance between the center O and the side 402b is equal to the distance X1. In addition the holding member 708 may fix the semiconductor light-emitting element 102 in such a manner that the distance between the center O and any of the sides 402b–d are fitted.

Moreover, the holding member 708 fixes the semiconductor light emitting element 102 in such a manner that the distance between the surface of the semiconductor light emitting element 102 and a plane which includes the sides 402a–402d is equal to the distance Z1. In this case, the semiconductor light-emitting element 102 can be also fixed with high accuracy. Thus, the vehicular lamp 10 (see FIG. 1) can form the light distribution pattern properly. Further, the holding member 708 may fix the semiconductor light emitting elements 102 in such a manner that the distance between the surface of the semiconductor light emitting elements 102 and the bottom end of the expanding member 954 is equal to the predetermined distance Z3.

Figure 16:
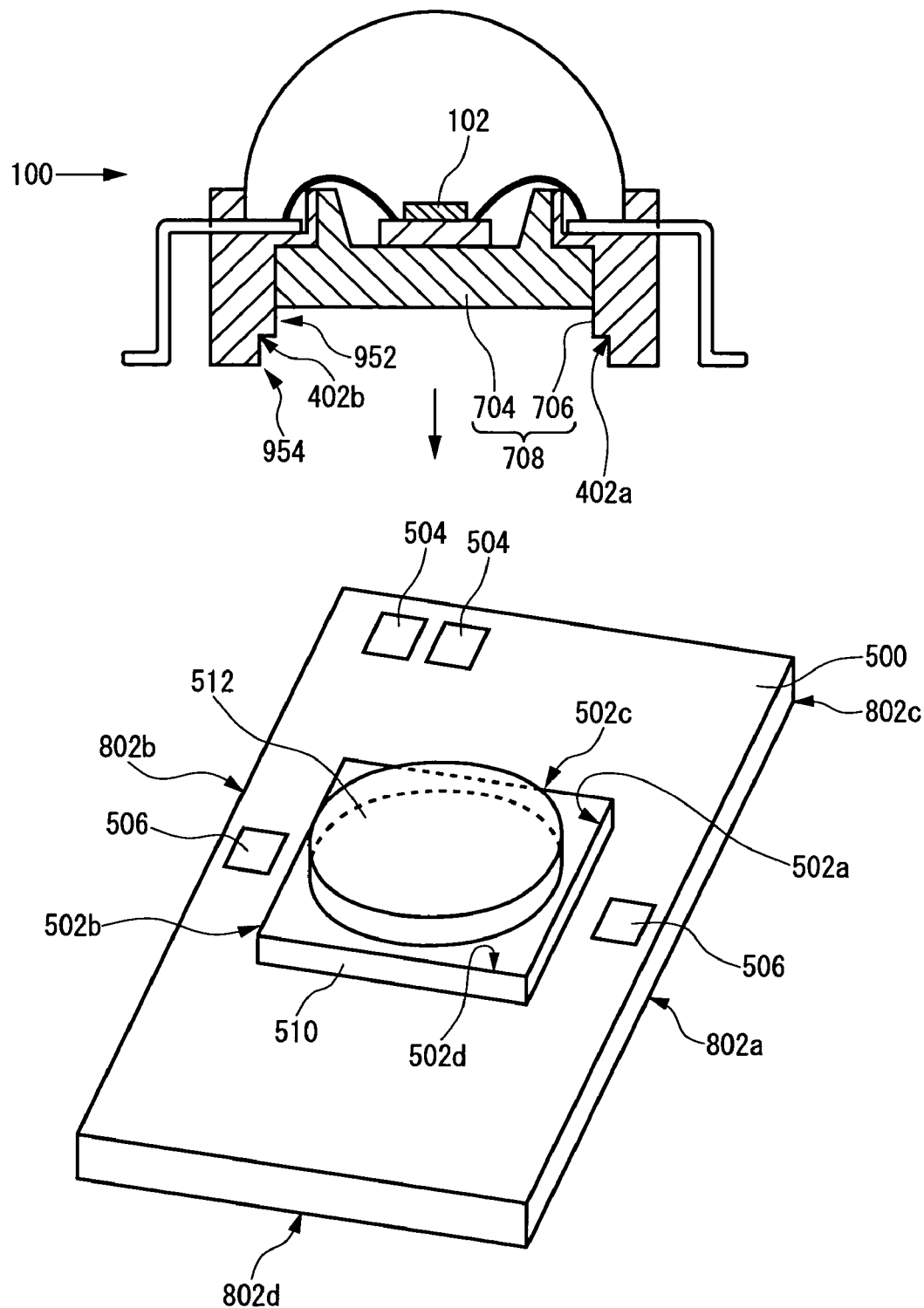
FIG. 16 shows another exemplary structure of the substrate.

FIG. 16 shows another exemplary structure of the substrate 500 with the LED module 100 explained in FIGS. 13, 14, and 15. Further, matters in FIG. 16 given the same symbols as those in FIG. 8 except the points to be described later will not be described because they have the same or similar functions as those in FIG. 8.

According to the present embodiment, the substrate 500 has a plurality of stand 510 and 512. The stand 510 and 512 are accommodated in holes of the holding member 708 so as to fix the LED module 100 to the reference position. The stand 512 has the sides 502a–502d corresponding to the sides 402a–402d on the top surface that is to be faced to the LED module 100. Each of the sides 502a–502d is an example of the reference side indicating the reference position where the LED module 100 is to be provided. The reference position is, for example, defined as a position a relative position of which with respect to the lens 204 (see FIG. 3) is predetermined, when the fixing member 202 (see FIG. 3) fixes the substrate 500.

The stand 510 allows the side face including the side 502a–502d to come into contact with the faces of the inside walls of the holding member 708 including the side 402a–402d, thereby fixing the LED module 100 to the reference position. Thus, the LED module 100 can be fixed with high accuracy.

The stand 512 is formed to be projected from the top surface. And the top surface of the stand 512 contacts with the bottom surface of the slug 704 when the substrate 500 fixes the LED module 100. Thus, the stand 512 receives the heat produced by the semiconductor-light emitting element 102 via the slug 704. According to the present embodiment, the LED module 100 can be fixed properly. Thus, the vehicular lamp 10 (see FIG. 1) can form the light distribution pattern properly.

Figure 19:
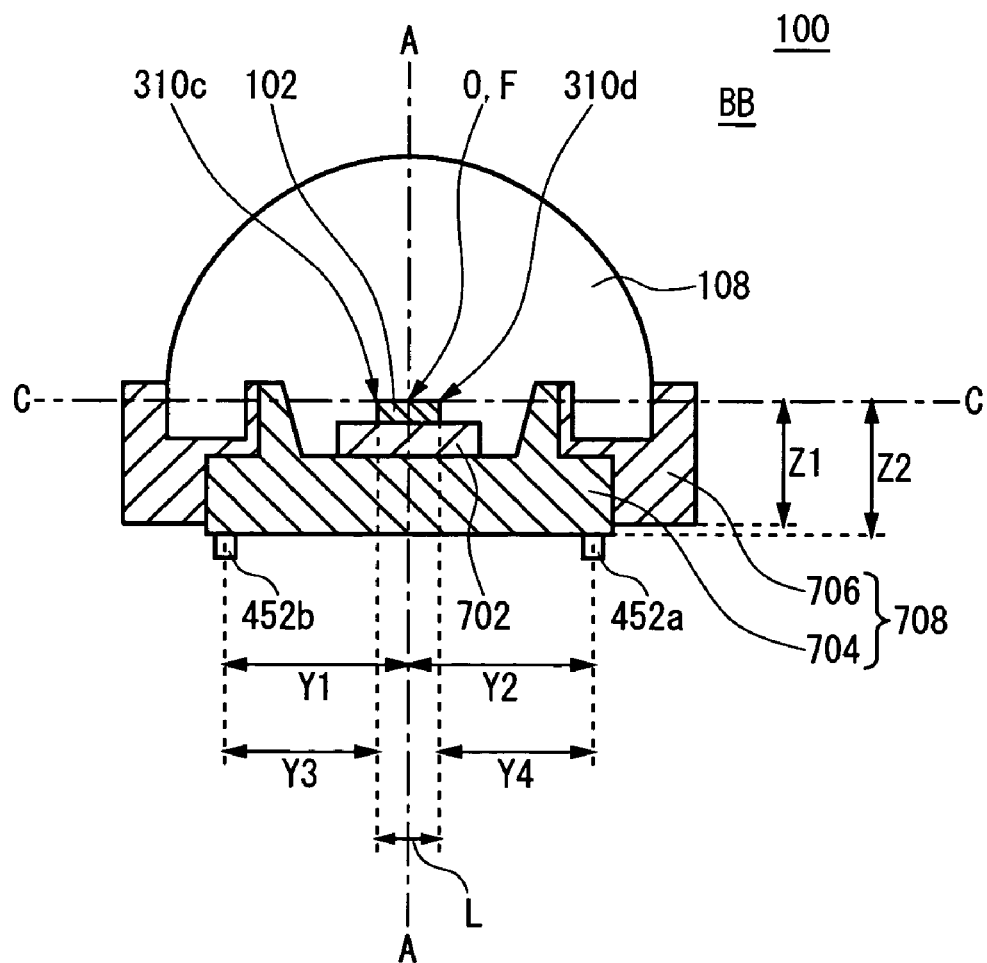
FIG. 19 shows a B—B cross-section of the LED module.
Figure 20:
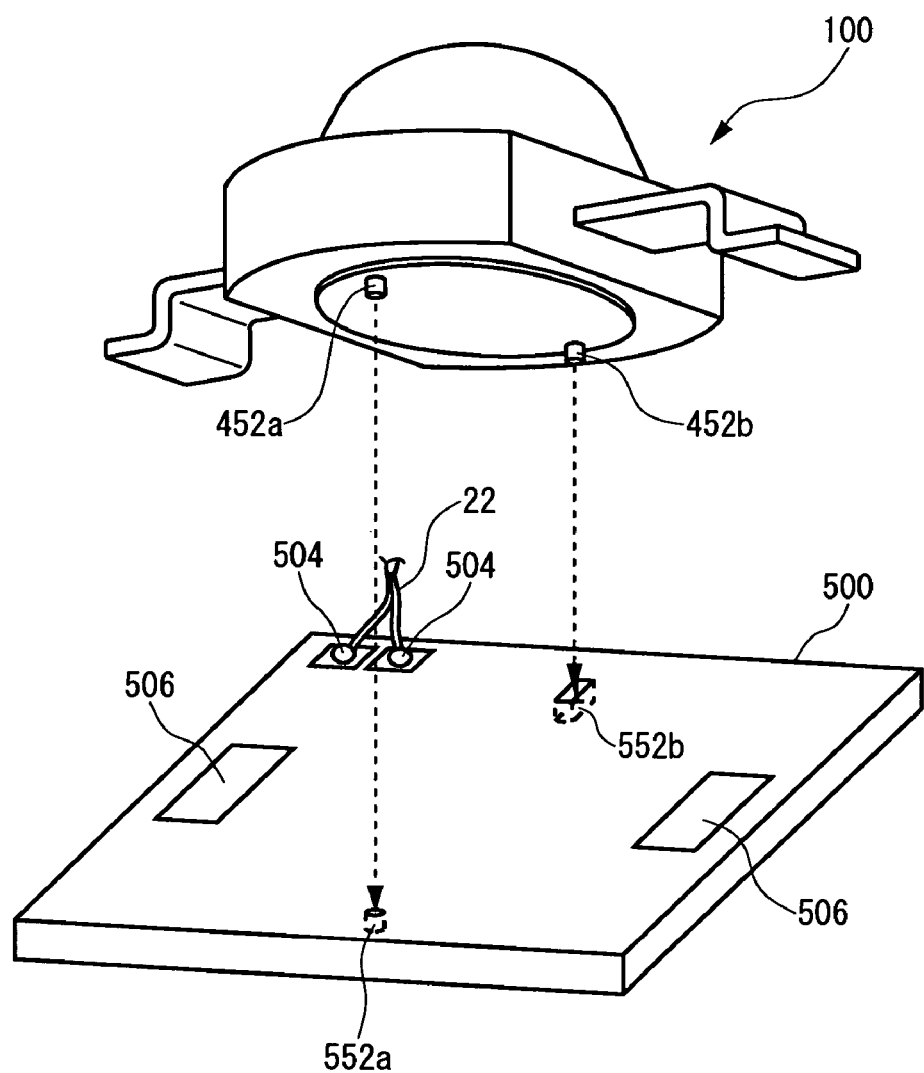
FIG. 20 shows another exemplary structure of the substrate.
Figure 21:
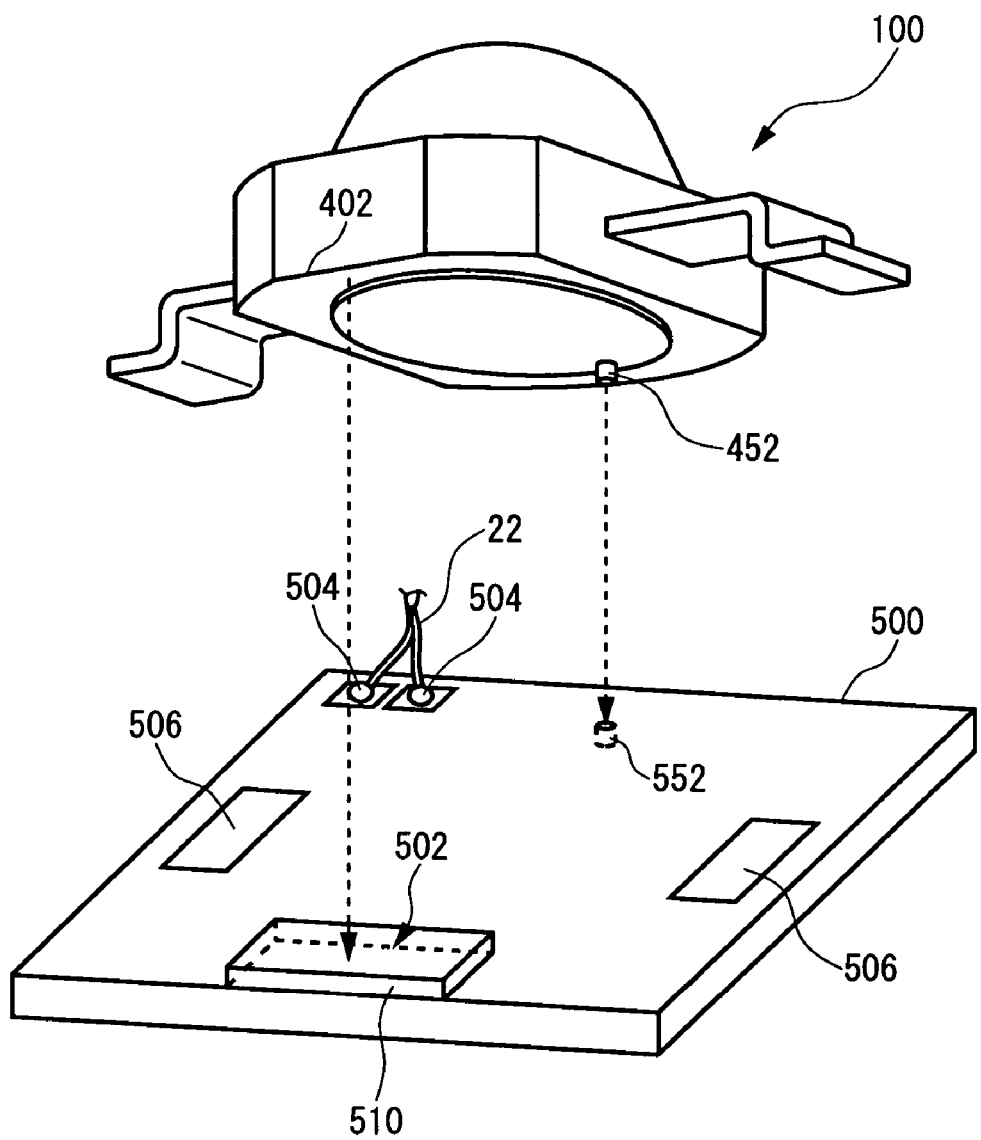
FIG. 21 shows another exemplary structure of the LED module and the substrate.

FIGS. 19, 20 and 21 show another embodiment of structure of the LED module 100. FIG. 19 shows a C—C cross-section of the LED module 100. FIG. 20 shows an A—A cross-section of the LED module 100. FIG. 21 shows a B—B cross-section of the LED module 100. Further, matters in FIGS. 19, 20 and 21 given the same symbols as those in FIGS. 5, 6, and/or 7 except the points to be described later will not be described because they have the same or similar functions as those in FIGS. 5, 6, and/or 7.

According to the present embodiment, the LED module 100 has a plurality of projections 452a and 452b. The projection 452a and 452b are projected from the bottom surface of the holding member 708 in the lower direction of the holding member 708. The projection 452a and 452b may be projected from the bottom surface of the slug 704.

The holding member 708 fits the center O at the lighting region of the semiconductor light emitting elements 102 to a position relative positions of which with respect to the projections 452a and 452b are predetermined, so as to fix the semiconductor light emitting elements 102. The holding member 708, for example, fixes the semiconductor light emitting elements 102 in such a manner that the distance between the center O and the projection 452a is equal to the distance Y2. The holding member 708 may fix the semiconductor light emitting elements 102 in such a manner that the distance between the center O and the projection 452b is equal to the distance Y1. In this case, the semiconductor light emitting elements 102 can be also fixed with high accuracy. Accordingly, the vehicular lamp 10 (see FIG. 1) can form the light distribution pattern properly.

Further, each of the projection 452a and 452b is an example of the reference member indicating the position of the semiconductor light emitting elements 102. The distance between the center O and the projection 452 is, for example, defined as the distance between each projected images when the center O and the central axes of the projection 452 are projected on the plane parallel to the surface of the semiconductor light-emitting element 102.

The holding member 708 may fix the semiconductor light-emitting element 102 in such a manner that the distance between the side 310b and the line which connects the projection 452a and 452b is equal to the distance X1 and the distance between the side 310a and the line which connects the projection 452a and 452b is equal to the distance X2. Accordingly, the center O can be fixed in a direction vertical to a direction along the projection 452a and 452b. The distance between the side 310b–b and the line which connects the projection 452a–b is, for example, defined as the distance between each projected images when the sides 310b or 310a and the line are projected on the plane parallel to the surface of the semiconductor light-emitting element 102. In another embodiment, the holding member 708 may fix the semiconductor light-emitting element 102 by fitting the distance the sides 310c–d to the projections 452a–b. In this case, the holding member 708 can fit the position of the center O properly so as to fix the semiconductor light-emitting element 102.

Figure 17:
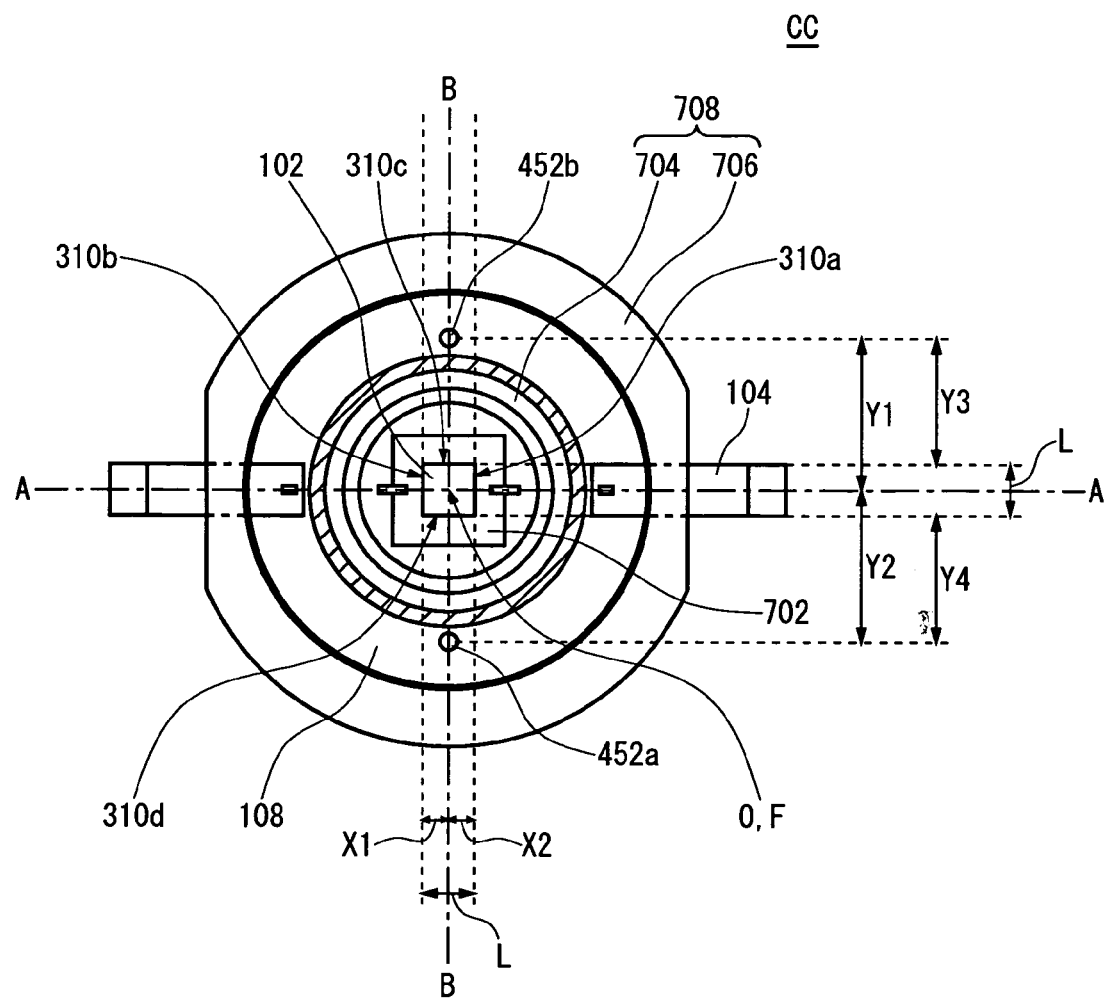
FIG. 17 shows a C—C cross-section of the LED module.
Figure 18:
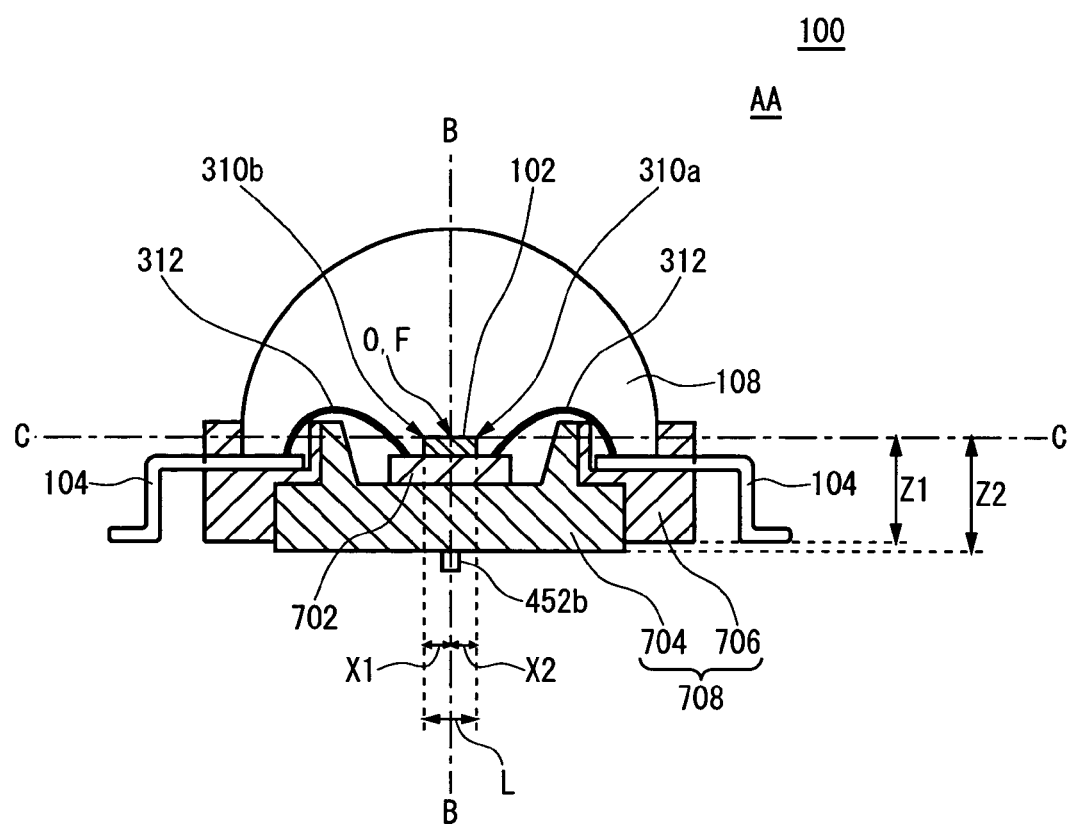
FIG. 18 shows an A—A cross-section of the LED module.

FIG. 20 shows another exemplary structure of the substrate 500 with the LED module 100 explained in FIGS. 17, 18, and 19. Further, matters in FIG. 20 given the same symbols as those in FIG. 8 except the points to be described later will not be described because they have the same or similar functions as those in FIG. 8.

According to the present embodiment, the substrate 500 has a plurality of connecting members 552a and 552b that are provided corresponding to the projections 452a and 452b. Each of the connecting members 552a and 552b is connected with each of the projections 452a and 452b when the substrate 500 fixes the LED module 100. The connecting members 552a and 552b are provided at the reference point where the LED module 100 is to be fixed. The reference position is, for example, defined as a position a relative position of which with respect to the lens 204 (see FIG. 3) is predetermined, when the holding member 708 (see FIG. 3) fixes the substrate 500. Thus, the substrate 500 can fix the LED module 100 to the lens 204 with high accuracy.

According to the present embodiment, the one connecting member 552b has a mechanical play which extends in the direction along the one connecting member 552b and the other connecting member 552a and then is connected with the projection 452b corresponding. And the other connecting member 552a is connected to the projection 452a corresponding with approximate no play in the same direction. Then, both the connecting members 552a and 552b are connected with the projections 452a and 452b with approximately no mechanical plays in the direction, which is vertical to said direction and parallel to the surface of the substrate 500. In this case the top of the projection 452b is connected to the connecting member 552b and then the projection 452a is connected to the connecting member 552a, thereby the LED module 100 can be provided to the substrate 500 easily. According to the present embodiment, the LED module 100 can be fixed properly. Thus, the vehicular lamp 10 (see FIG. 1) can form the light distribution pattern properly.

According to still another embodiment, the LED module 100 may have a hole (see FIG. 19) formed at the holding member 708 in place of the projection 452a and 452b. In this case, the substrate 500 may have a projection to be connected with this hole as the connecting member 552a and 552b. In this case, the LED module 100 can be fixed properly. Further, the LED module may have a hole formed at the holding member 708 in place of any one of the projection 452a or 452b. The substrate 500 may have a hole and a projection to be connected with these members as a plurality of the connecting member 552a and 552b.

FIG. 21 shows another exemplary structure of the LED module 100 and the substrate 500. Further, matters in FIG. 21 given the same symbols as those in FIGS. 5 to 8, and FIGS. 16 to 20 except the points to be described later will not be described because they have the same or similar functions as those in FIGS. 5 to 8 and FIGS. 16 to 20.

According to the present embodiment, the LED module 100 has the side 402 and the projection 452. Each of the side 402 and the projection 452 is an example of the reference member indicating the position of the semiconductor light-emitting element 102 (see FIG. 5).

Moreover, the substrate 500 has a stand 510 and a connecting member 552. The stand 510 includes a side 502. The stand 510 and the connecting member 552 indicate the reference position where the LED module 100 is to be provided.

The stand 510 allows the side face including the side 502 to come into contact with the faces of the inner walls of the LED module 100 including the side 402 when the substrate 500 fixes the LED module 100. The connecting member 552 is connected to the projection 452. In this case, the LED module 100 can be fixed with high accuracy. Thus, According to the present embodiment, the vehicular lamp 10 (see FIG. 1) can form the light distribution pattern properly.

Figure 22:
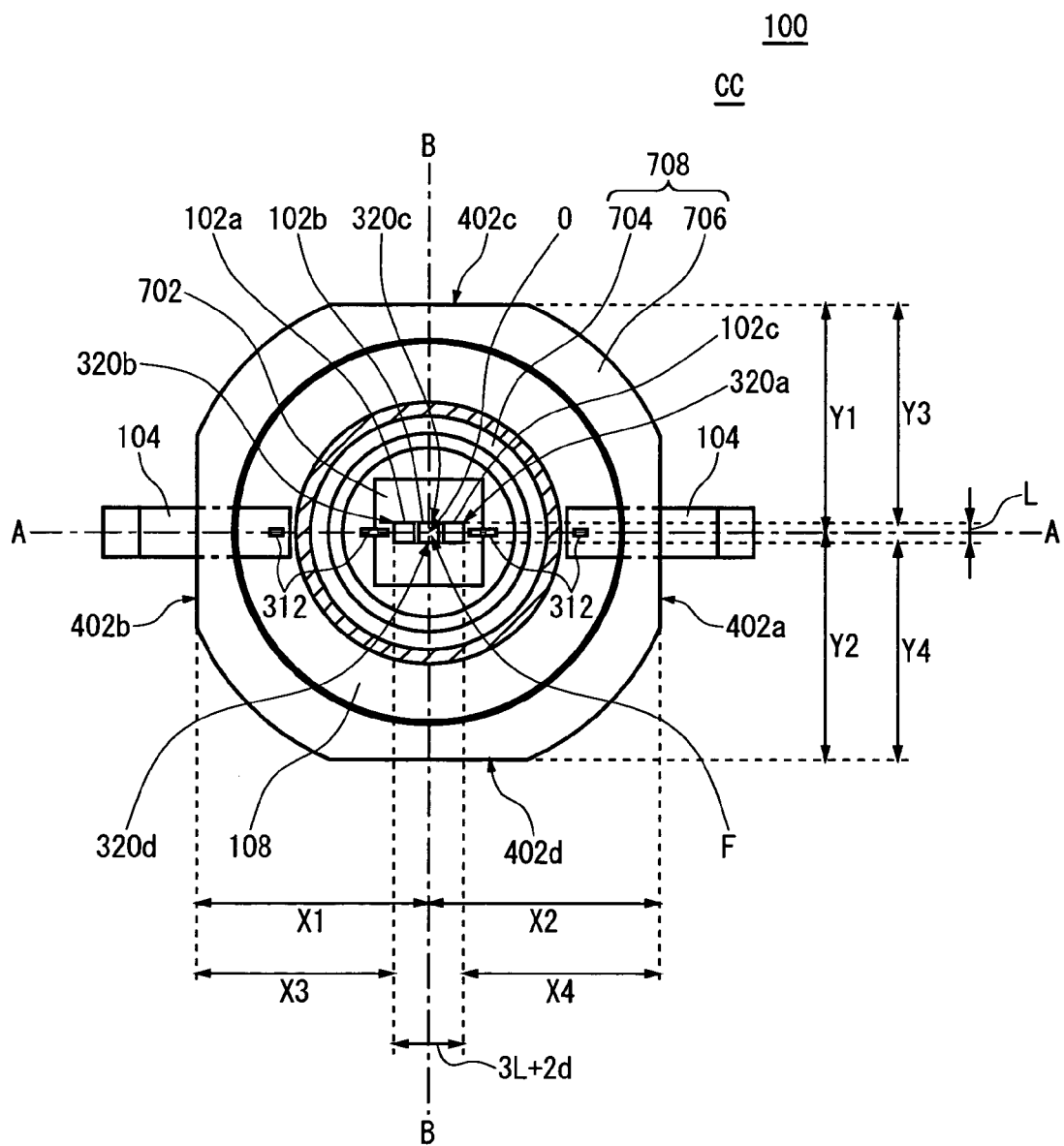
FIG. 22 shows another exemplary structure of the LED module.

FIG. 22 shows another exemplary structure of the LED module 100. Further, matters in FIG. 24 given the same symbols as those in FIGS. 5 to 7 and/or FIG. 12 except the points to be described later will not be described because they have the same or similar functions as those in FIGS. 5 to 7 and/or FIGS. 12A and 12B.

According to the present embodiment, the LED module 100 has a plurality of the semiconductor light-emitting elements 102. A plurality of semiconductor light emitting elements 102a–c are positioned in order, for example, with their clearance d that is about less than 0.01 mm, in a approximate square region surrounded by the imaginary line segment 320a–320d to allow one of the sides to be fitted to the imaginary line segment 320d.

The holding member 708 adjusts the distance between the center O at the lighting region of the semiconductor light-emitting elements 102 and at least a part of a plurality of the sides 402a–402d so as to fix the semiconductor light emitting elements 102a–c. The holding member 708 fixes the semiconductor light emitting elements 102a–c in such a manner that the distance between the center O and the side 420d is equal to the distance Y2, for example. The holding member 708 may adjust the distance between the center O and any sides 402b–d so as to fix the semiconductor light emitting elements 102. According to the present embodiment, semiconductor light emitting elements 102a–c can be fixed with high accuracy. Thus, the vehicular lamp 10 can form the light distribution pattern properly.

The vehicular lamp to which the present invention may be applied includes headlamps such as a regular headlamp, fog lamp or cornering lamp for automobiles, motorcycles or trains.

Although the present invention has been described by way of exemplary embodiments, it should be understood that those skilled in the art might make many changes and substitutions without departing from the spirit and the scope of the present invention which is defined only by the appended claims.

What is claimed is:

1. A vehicular lamp used in a vehicle, comprising:
   a light source module for generating light;
   an optical member operable to emit the light generated by said light source module out of the vehicular lamp; and
   a light source fixing member which fixes said light source module to a reference position which has a predetermined relative position with respect to said optical member,
   wherein said light source module includes:
      a reference member which is fixed to be fitted to said reference position when said light source module is fixed to said optical member;
      a semiconductor light emitting element which emits light from a lighting region that is predetermined; and
      a holding member which fits a center of said lighting region to a predetermined relative position with respect to said reference member, so as to hold said semiconductor-emitting light.

2. A vehicular lamp as claimed in claim 1, wherein said reference member is one side of said holding member, and said light source fixing member has a reference side to indicate said reference position and allows a plane which includes said one side to come into contact with a plane which includes said reference side, so as to fit said reference member to said reference position, thereby fixing said light source module.

3. A vehicular lamp as claimed in claim 1, wherein said reference member is a hole or a projection formed in said holding member, and said light source fixing member includes a connecting member which is to be connected to said reference member corresponding to said hole or said projection at the position of said reference position.

4. A vehicular lamp as claimed in claim 3, wherein said light source module includes at least two said reference positions, said light source fixing member includes at least two said connecting members which are connected to at least said two reference members respectively, and one of said two connecting members connects said reference members corresponding, including a mechanical play extending in the direction from one connecting member to the other connecting member.

5. A vehicular lamp as claimed in claim 3, wherein said reference member has a first reference section as said hole or said projection and has a second reference section as a side of said holding member, and said light source fixing member includes a reference side to indicate said reference position and allows a plane which includes said one side to come into contact with a plane which includes said reference side so as to fit said reference member to said reference position.

6. A vehicular lamp as claimed in claim 1, wherein the predetermined relative position with respect to said reference member is a focus of the optical member.

7. A vehicular lamp as claimed in claim 1, wherein said light source module is fixed the predetermined relative position with respect to said reference member with an error less than or equal to 5 percent with respect to the length of an edge of the semiconductor light emitting element.

8. A vehicular lamp as claimed in claim 1, wherein said light source module is fixed the predetermined relative position with respect to said reference member with an error less than or equal to 1 percent with respect to the length of an edge of the semiconductor light emitting element.

9. A light source module for generating light, comprising;
a reference member which is fitted to a reference position that is predetermined so as to fix said light source module when said light source module is fixed to said reference position,
a semiconductor light emitting element which emits light from a lighting region that is predetermined; and
a holding member which fits a center of said lighting region to a predetermined relative position with respect to said reference member, so as to hold said semiconductor-emitting light;
wherein said light source module is fixed the predetermined relative position with respect to said reference member with an error less than or equal to 5 percent with respect to the length of an edge of the semiconductor light emitting element.

10. A light source module as claimed in claim 9, wherein the predetermined relative position with respect to said reference member is a focus of the optical member.

11. A light source module as claimed in claim 9, wherein said light source module is fixed the predetermined relative position with respect to said reference member with an error less than or equal to 1 percent with respect to the length of an edge of the semiconductor light emitting element.

* * * * *